United States Patent
Marks et al.

(10) Patent No.: US 10,922,849 B2
(45) Date of Patent: Feb. 16, 2021

(54) GRID RETAINING IRREGULAR NETWORK IN 3D

(71) Applicant: The Government of the United States of America, as represented by the Secretary of the Navy, Arlington, VA (US)

(72) Inventors: David B. Marks, Metairie, LA (US); Brian S. Bourgeois, Slidell, LA (US)

(73) Assignee: The Government of the United States of America, as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 16/402,765

(22) Filed: May 3, 2019

(65) Prior Publication Data

US 2019/0378307 A1 Dec. 12, 2019

Related U.S. Application Data

(60) Provisional application No. 62/666,493, filed on May 3, 2018.

(51) Int. Cl.
*G06T 17/20* (2006.01)
*G06T 9/00* (2006.01)
*H03M 7/30* (2006.01)

(52) U.S. Cl.
CPC .............. *G06T 9/001* (2013.01); *G06T 17/20* (2013.01); *H03M 7/30* (2013.01)

(58) Field of Classification Search
CPC ........... G06T 9/001; G06T 17/20; H03M 7/30
See application file for complete search history.

(56) References Cited

U.S. PATENT DOCUMENTS

| | | | |
|---|---|---|---|
| 9,406,169 B2 | 8/2016 | Marks et al. | |
| 2012/0038640 A1* | 2/2012 | Lee | G06T 17/005 345/420 |
| 2016/0180586 A1* | 6/2016 | Marks | G06T 17/20 345/423 |

OTHER PUBLICATIONS

Fowler and Fox, "Embedded Wavelet-Based Coding of Three-Dimensional Oceanographic Images with Land Masses", IEEE Transactions on Geoscience and Remote Sensing, Feb. 2001, vol. 39 pp. 284-290.

Bourgeois, et al., "GRIN for advanced geospatial data representations", 2015 SEG Intl. Exposition, New Orleans, LA Oct. 18-23, 2015.

Marc van Kreveld, "Algorithms for Triangulated Terrains," Jul. 29, 2005, SOFSEM '97: Theory and Practices of Informatics; vol. 1338 of the series Lecture Notes in Computer Science pp. 19-36.

(Continued)

*Primary Examiner* — Chong Wu
(74) *Attorney, Agent, or Firm* — US Naval Research Laboratory; William P. Ladd

(57) ABSTRACT

Systems and methods are provided for compression of 3 dimensional (3D) geophysical (e.g., air temp, water temp, wind, current, humidity, salinity, etc.) datasets that contain regions of NaNs (IEEE standard representation for Not a Number) that represent land, i.e. geographic positions that do not have valid data. Embodiments of the present disclosure allow constraint of the error magnitude by a user specified threshold, where compression and error are inherent tradeoffs.

20 Claims, 23 Drawing Sheets

(56) References Cited

OTHER PUBLICATIONS

Pajarola, Renato, Zurich, Eth, Large Scale Terrain Visualization Using the Restricted Quadtree Triangulation, The Computer Society, IEEE, 1998.
Guibas, Leonidas, Stolfi, Jorge, Primitives for the Manipulation of General Subdivisions and the Computation of Voronoi Diagrams, pp. 74-123, ACM Transactions on Graphics, vol. 4, No. 2, Apr. 1985.
Evans, W., Kirkpatrick, D., Townsend, G. Right-Triangulated Irregular Networks, Algorithmica, pp. 264-286, 2001.
Suarez, J.P., Plaza, A., Four-triangles adaptive algorithms for RTIN terrain meshes, Mathematical and Computer Modeling 49, pp. 1012-1020, 2009.
Sivan, Ron, Samet, Hanan, Algorithms for Constructing Quadtree Surface Maps, Proceedings 5th International Symposium on Spatial Data Handling, Aug. 3-7, 1992, pp. 361-370.

\* cited by examiner

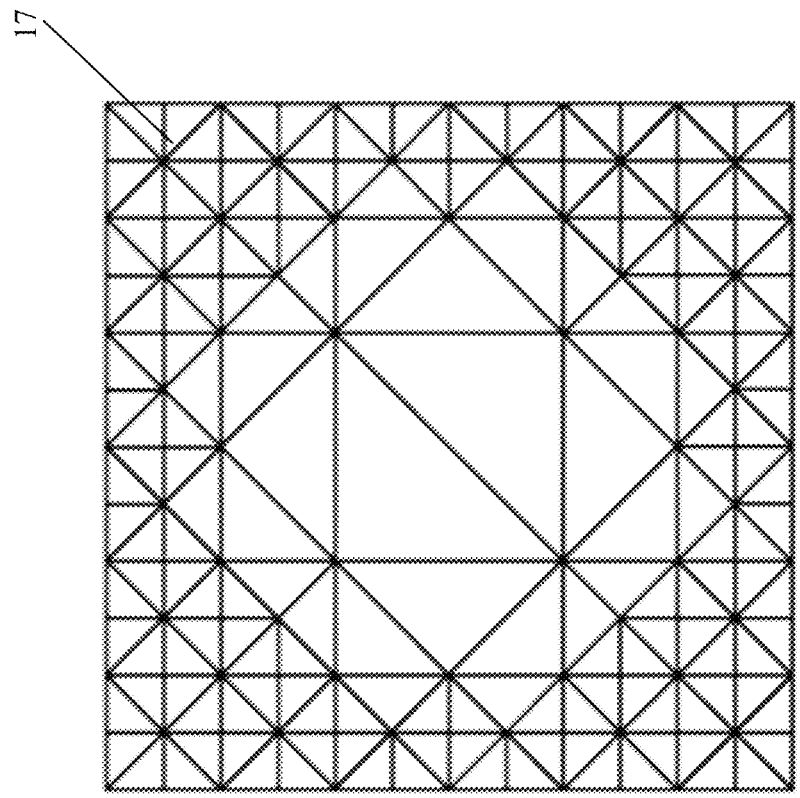
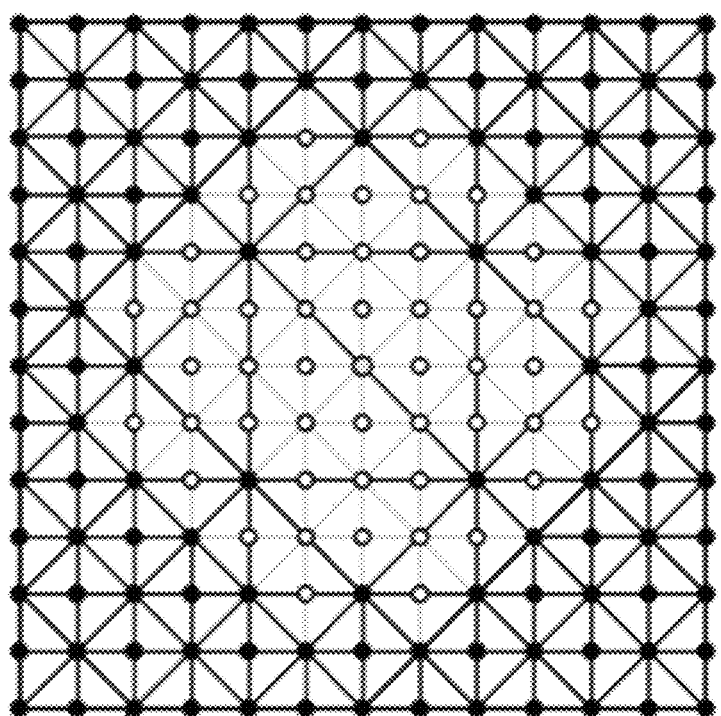
FIG. 1B

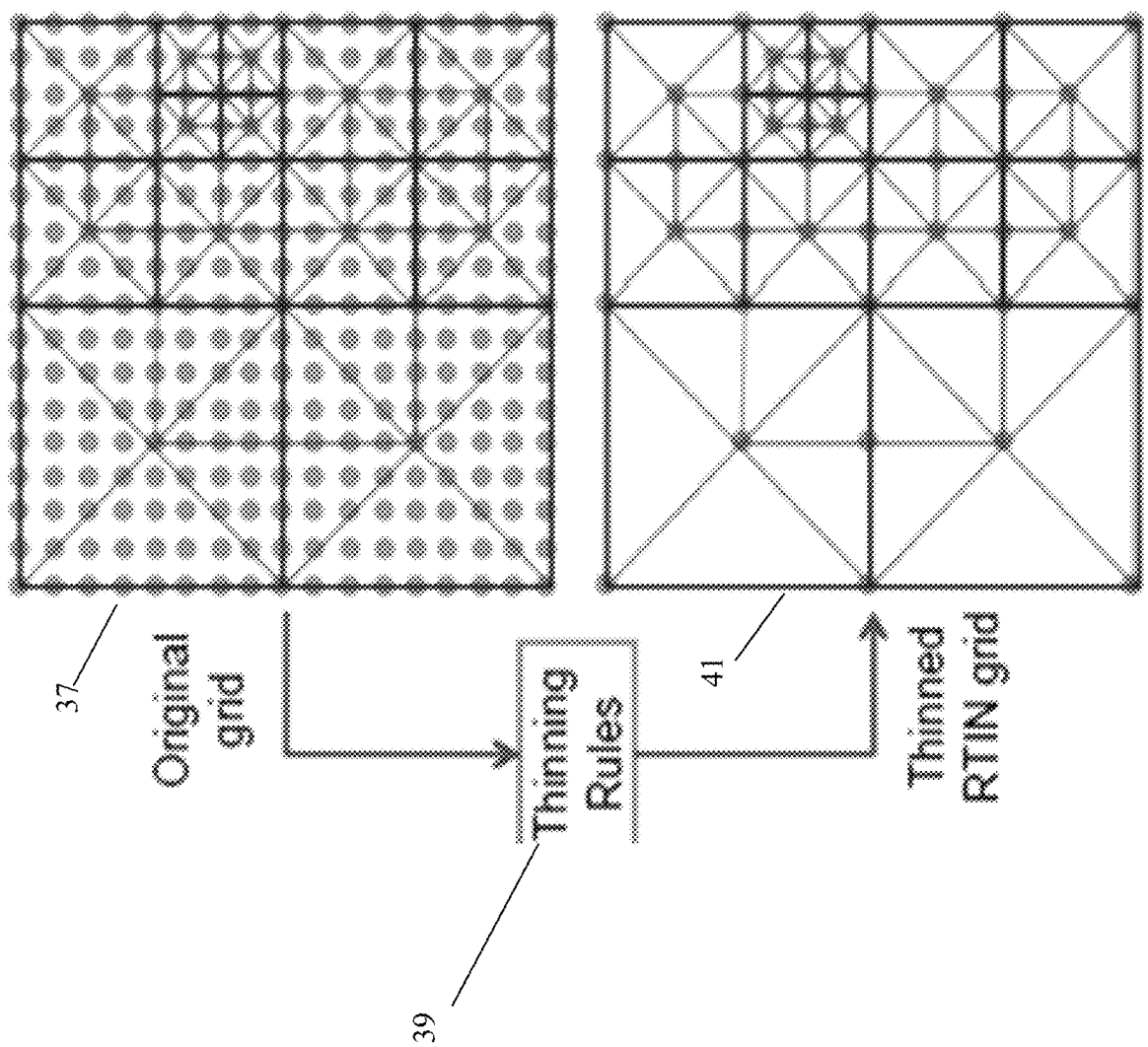

|  | 1m | 3m | 10m | 30m | 100m | 300m |
|---|---|---|---|---|---|---|
|  | 3.81 | 0.79 | 0.09 | 0.01 | 0.01 | 0.00 |
| 0.03% | 19.75 | 20.30 | 19.76 | 19.75 | 19.75 | 19.75 | 19.75 |
| 0.1% | 8.44 | 9.78 | 8.54 | 8.44 | 8.44 | 8.44 | 8.44 |
| 0.3% | 5.24 | 7.39 | 5.41 | 5.25 | 5.24 | 5.24 | 5.24 |
| 1% | 3.42 | 6.06 | 3.75 | 3.44 | 3.42 | 3.42 | 3.42 |
| 3% | 2.79 | 5.70 | 3.24 | 2.82 | 2.80 | 2.79 | 2.79 |
| 10% | 2.22 | 5.29 | 2.73 | 2.26 | 2.23 | 2.22 | 2.22 |
| 50% | 1.79 | | | 1.84 | | | |
| 100% | 1.73 | | | 1.78 | | | |
| 200% | 1.71 | | | 1.76 | | | |
| 400% | 1.70 | | | 1.76 | 1.71 | 1.71 | 1.70 |

FIG. 12B

GRID RETAINING IRREGULAR NETWORK IN 3D

CROSS REFERENCE TO RELATED APPLICATIONS

This application claims the benefit of U.S. Provisional Patent Application No. 62/666,493, filed on May 3, 2018, which is incorporated by reference herein in its entirety.

FIELD OF THE DISCLOSURE

This disclosure relates to data compression, including geospatial data compression.

BACKGROUND

Government agencies are responsible for maintaining global databases for the making of, for example, but not limited to, aeronautical/hydrographic charts and terrain map products. A global 100 m grid requires ~1 Tbyte of storage space, a 10 m grid requires ~100 Tbytes of storage space. Unlike image compression, grid compression can retain the surface shape. Right Triangulated Integrated Networks (RTINs) have been used extensively in Computer Graphics for high-speed rendering of 3D scenes. As this technology is mature, it has been selected as the best candidate for computationally efficient thinning of topological grids.

Significant size reduction was demonstrated using the RTIN Top Down approach (creating a RTIN from a set of points and adding in more detail/triangles as needed to preserve fidelity) However, the Top Down approach does not preserve the original grid points, a requirement for charting applications using topological grids. What is needed is a developed bottom-up approach, i.e. an approach that starts with a full grid and iteratively eliminates triangles.

Improper tessellation can arbitrarily limit the amount of thinning possible within a given mesh. What is needed is a tessellation of triangles into a unique RTIN structure to allow for proper thinning to take place. Right-TIN creation results in a non-unique Delaunay mesh. What is needed is a process to determine valid removable vertices (also referred to herein as points) within the RTIN and the orientation of the removable edges. Improper vertex or edge removal can result in either the destabilization of the RTIN structure (a mesh that is no longer an RTIN) or an irreducible RTIN (a configuration that cannot be further reduced without becoming destabilized). What is needed is proper vertex and edge detection to ensure that all RTINs can be fully reduced. What is needed is an approach that utilizes a combination of metrics to, for example, but not limited to, retain data in the shallows while trimming flat areas of little interest. What is needed is an approach that allows compression of 3D global geophysical data (temperature, humidity, salinity, wind, current, etc.) with user specified loss of fidelity.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings:

FIG. 1A Prior Art is a graphical illustration of the Top-Down approach in which an RTIN is created, and then more detail is added to preserve fidelity to the original data;

FIG. 1B is a graphical illustration the Bottom-Up approach of the present embodiment in which detail is removed from an RTIN while retaining fidelity to the original data through adhering to specific thinning selection criteria;

FIG. 2 Prior Art is a graphical illustration of the TIN technique;

FIG. 5 is a graphical illustration of a grid as it is subjected to the thinning rules of the present embodiment;

Figure 1A:
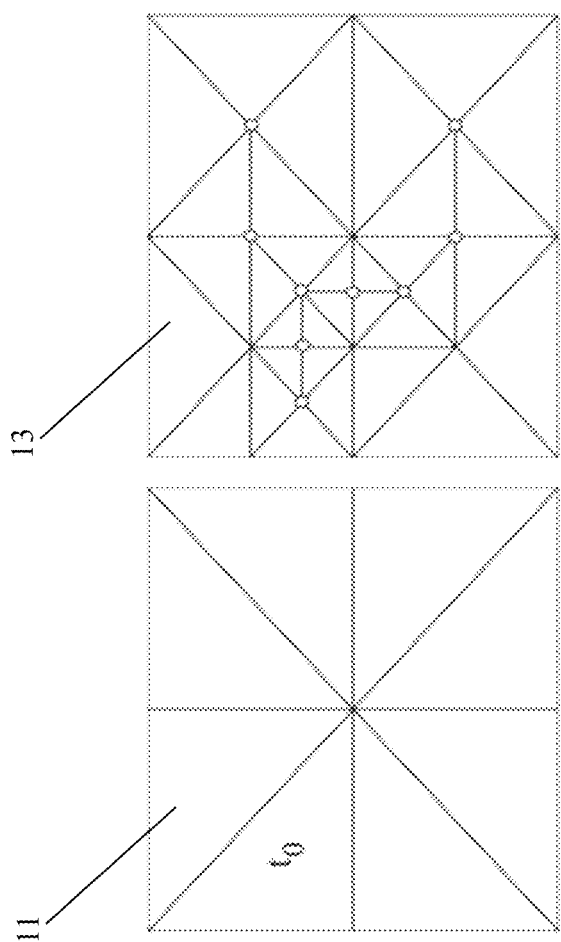
Figure 13:
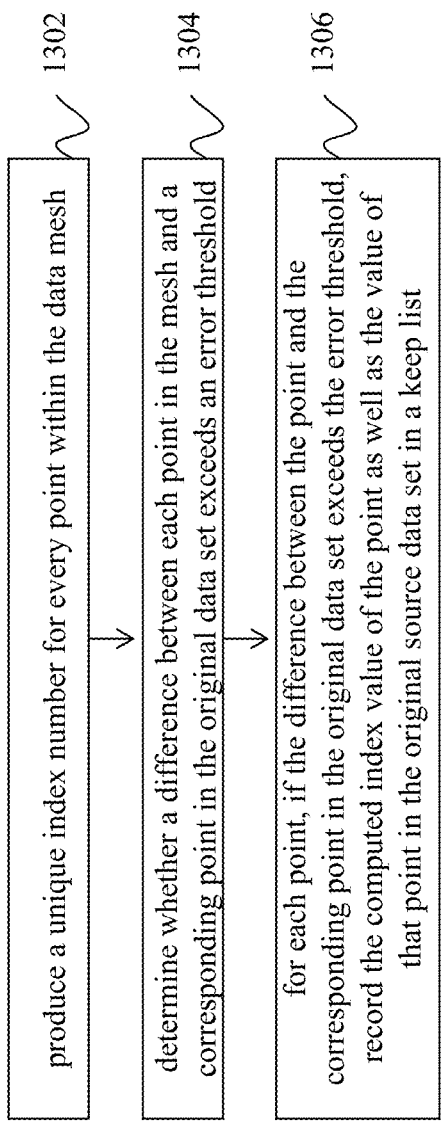
Figure 14A:
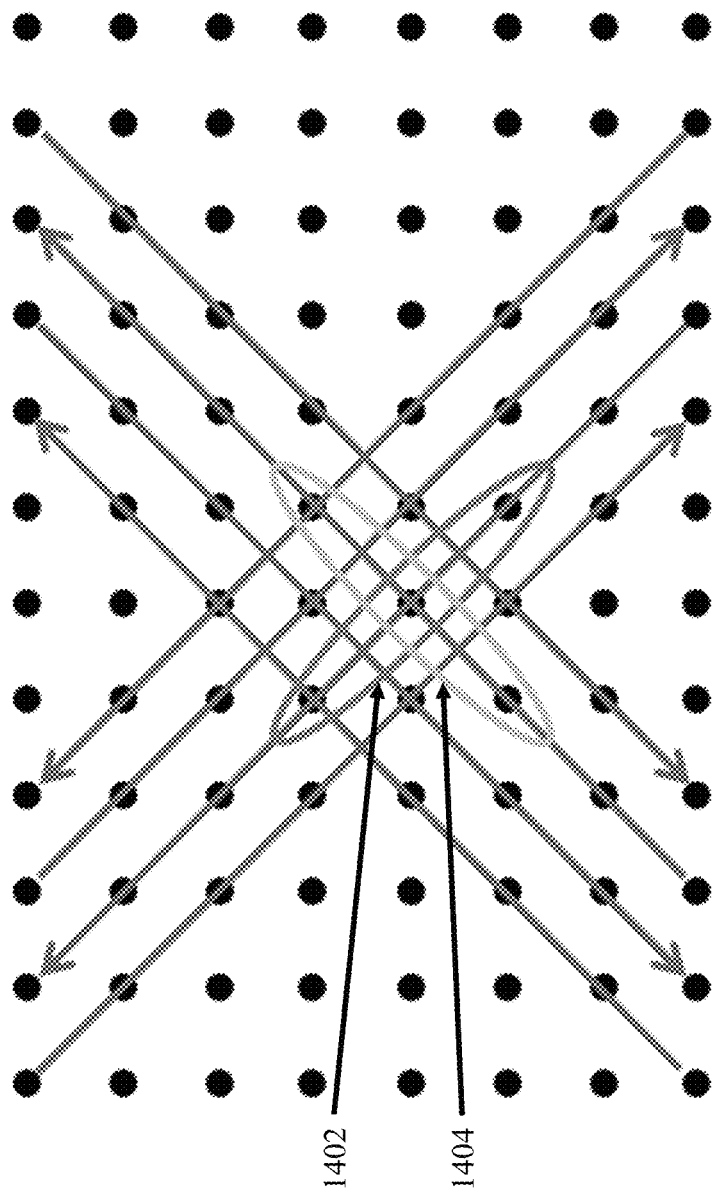
Figure 14B:
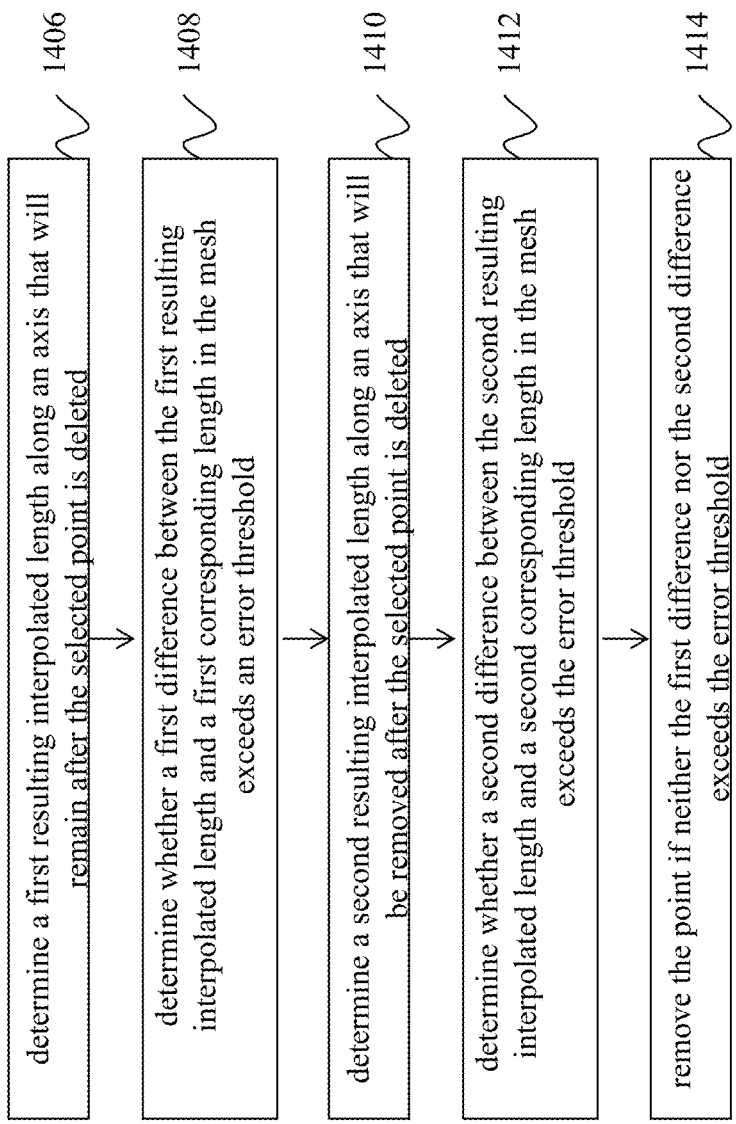
Figure 15:
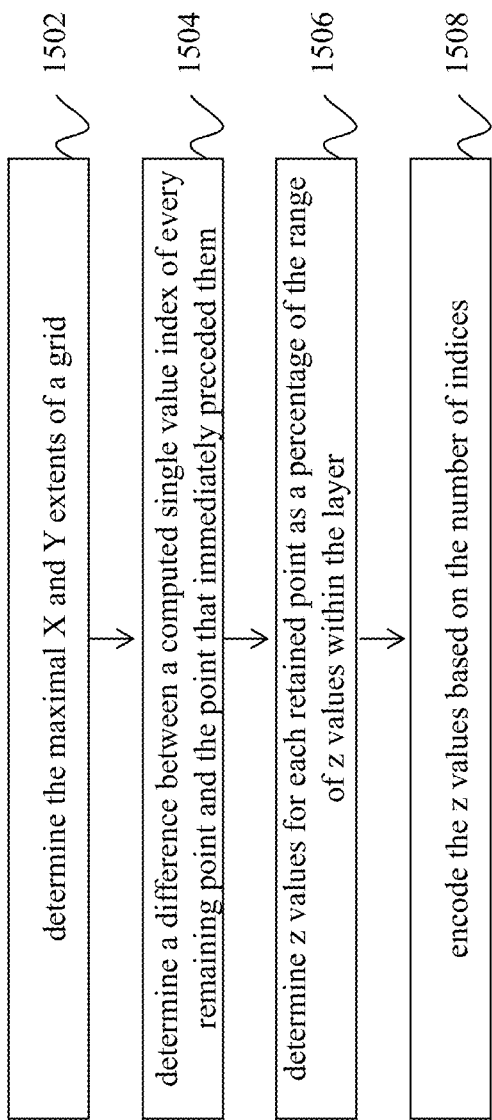
Figure 16:
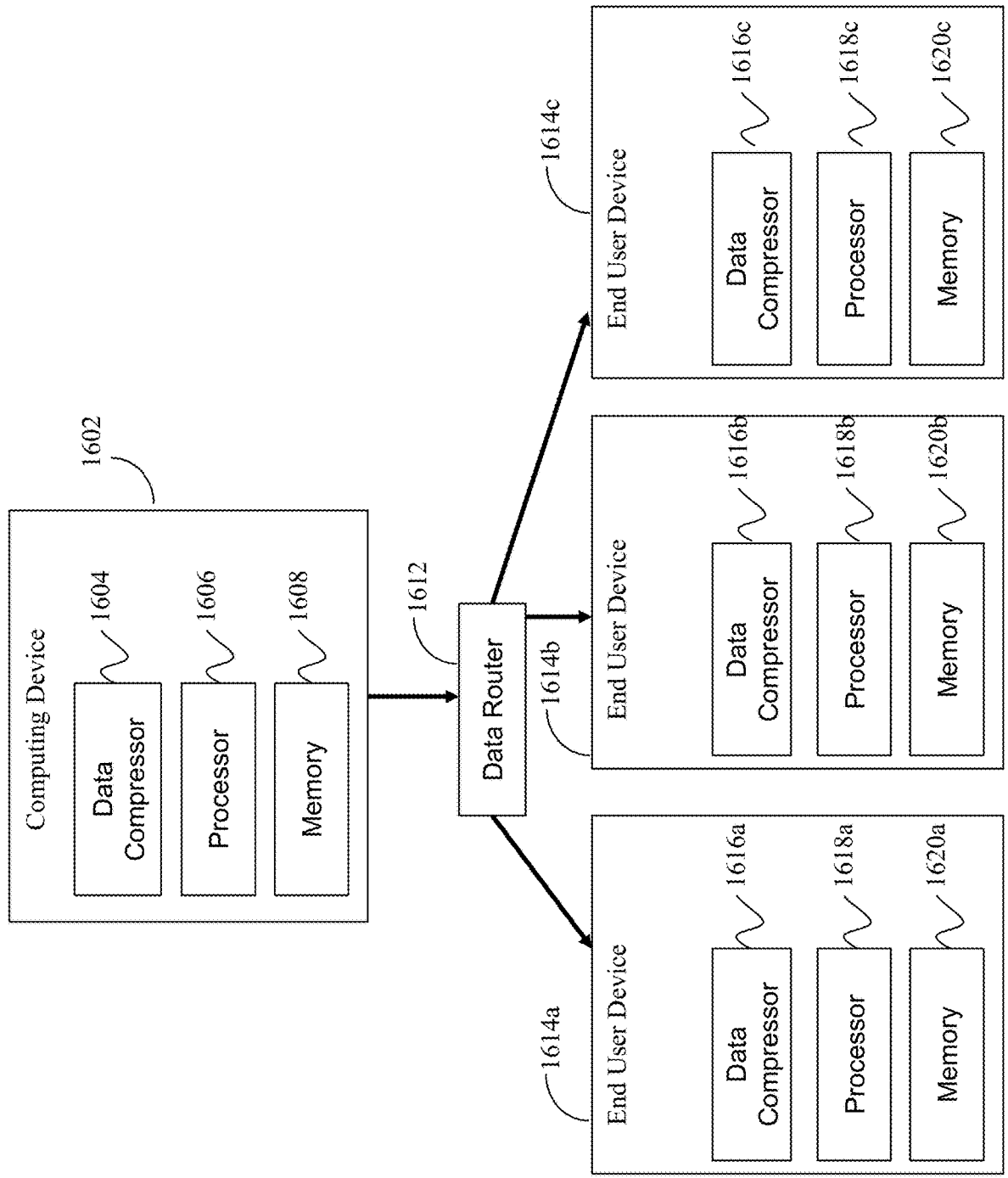
Figure 17:
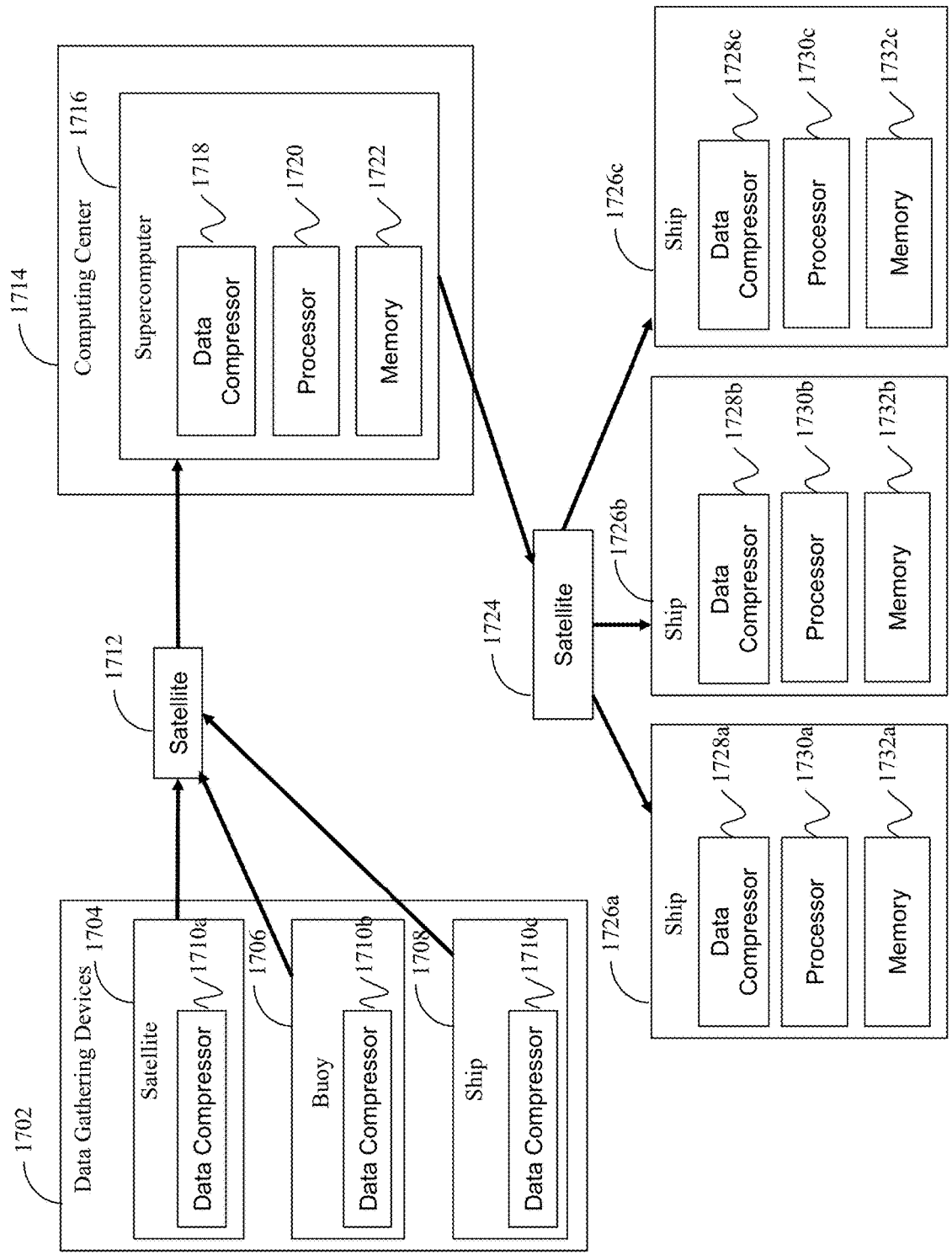

FIG. 12B is a table of the percentage of the original number of points remaining after thinning. Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number;

FIG. 13 is a flowchart of a method for generating a keep list in accordance with an embodiment of the present disclosure;

FIG. 14A is a diagram illustrating point triplets in accordance with an embodiment of the present disclosure;

FIG. 14B is a flowchart of a method for bi-directional point elimination analysis in accordance with an embodiment of the present disclosure;

FIG. 15 is a flowchart of an exemplary method for compact encoding in accordance with an embodiment of the present disclosure;

FIG. 16 is a diagram of an exemplary system that compresses and decompresses data in accordance with an embodiment of the present disclosure; and FIG. 17 is a diagram of another exemplary system that compresses and decompresses data in accordance with an embodiment of the present disclosure.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to understand that such description(s) can affect such feature, structure, or characteristic in connection with other embodiments whether or not explicitly described.

1. Overview

Embodiments of the present disclosure provide systems and methods that enable compression of 3 dimensional (3D) geophysical (e.g., air temp, water temp, wind, current, humidity, salinity, etc.) datasets that contain regions of NaNs (IEEE standard representation for Not a Number) that represent land, i.e. geographic positions that do not have valid data. In an embodiment, this is a lossy compression, meaning that there can be error between the reconstructed data at each location and the original data. Embodiments of the present disclosure allow constraint of the error magnitude by a user specified threshold, where compression and error are inherent tradeoffs. A unique characteristic of techniques using a Grid Retaining Irregular Network (GRIN) in accordance with an embodiment of the present disclosure as compared to other lossy compression techniques is that a subset of original, unaltered points are retained, which are then used to reconstruct the grid.

2. Grid Retaining Irregular Network (GRIN)

The present embodiment tessellates the triangles of a Delaunay mesh of a gridded surface, such as, for example, but not limited to, a bathymetric grid, into a unique RTIN structure, the gridded data having been quality controlled and converted to a standard gridded format. The present embodiment determines valid removable vertices within the RTIN and the orientation of the removable edges (necessary to preserve the tessellation pattern). The present embodiment, by use of thresholds, retains data, for example, in the shallows while trimming flat areas of little interest.

Referring now to FIG. 1A Prior Art, the Top-Down approach of the prior art starts with coarse level grid 11 and adds more nodes to dense grid 13. The Top-Down approach is invalid for the application to bathymetric data because all original point locations are lost in the process. This is because the Top-Down approach starts with a perfectly square, fully-thinned RTIN and adds triangles until the RTIN satisfies a preset level of refinement. By starting with a dense grid and removing points, the Bottom-Up approach retains the original points, a vital feature for bathymetric data and other forms of data arising out of sensor readings.

Referring now to FIG. 1B, the Bottom-Up approach of the present embodiment starts with dense grid 15 and removes points while maintaining the RTIN in thinned grid 17. Criteria for grid point removal can be determined by, for example, but not limited to, user input and electronic computations. The Bottom-Up approach results in more control of the data, for example, topographic control, than the Top-Down approach, because the Bottom-Up approach works with the actual full grid. The output can be directly compared to the original grid without any adjustment. As the original points are lost with the Top-Down approach, any attempt to track down an anomaly in the data, for instance, will require figuring out what part of the original data translates to the anomaly.

Figure 2:
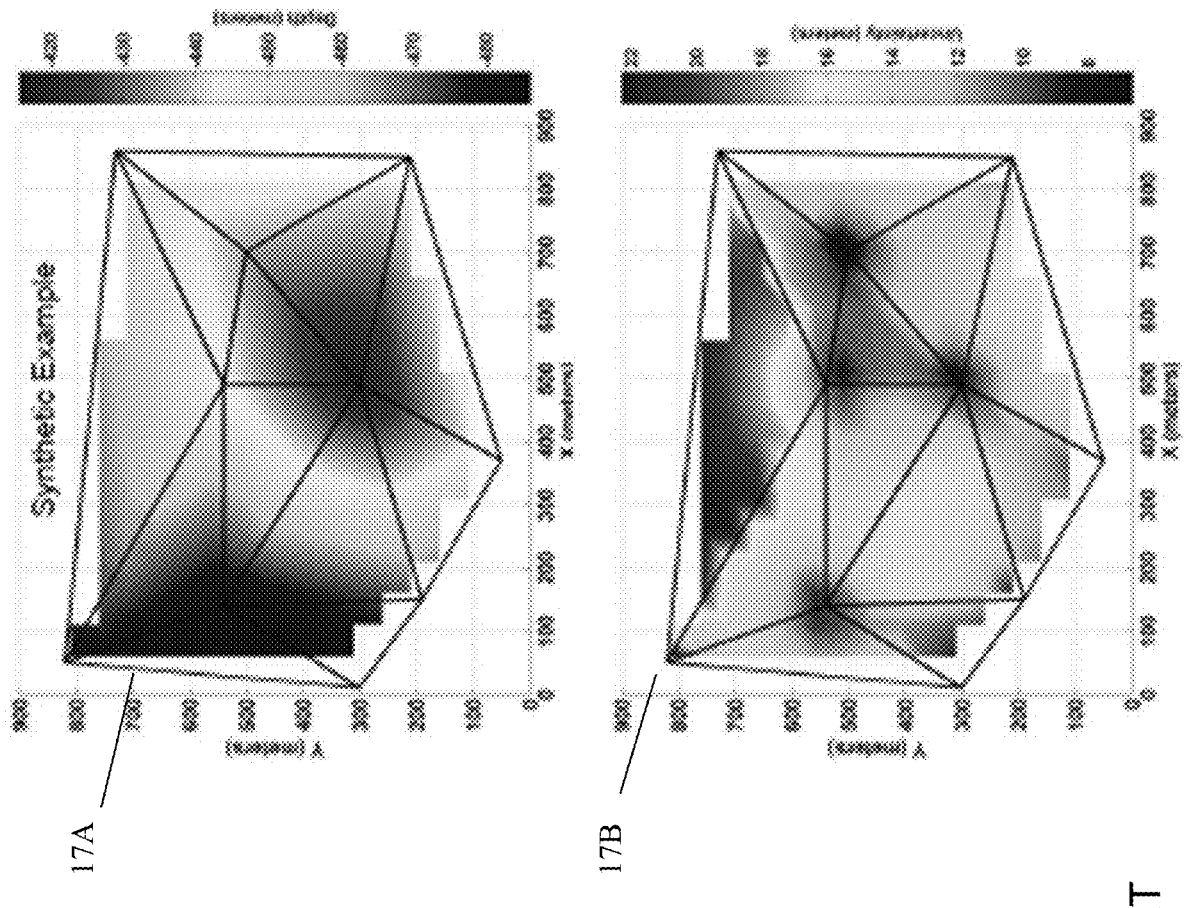

Referring now to FIG. 2, Prior Art, Triangular Irregular Network (TIN) is an alternative to the system and method of the present embodiment. In the TIN technique, contiguous irregular triangular meshes 17A and 17B are created by maximizing the angles of the triangles in the mesh. TIN technology can be appropriate for sparse, irregularly-spaced data. However, TIN point removal results in recalculation, and its focus is on general point space versus point localization.

Figure 3:
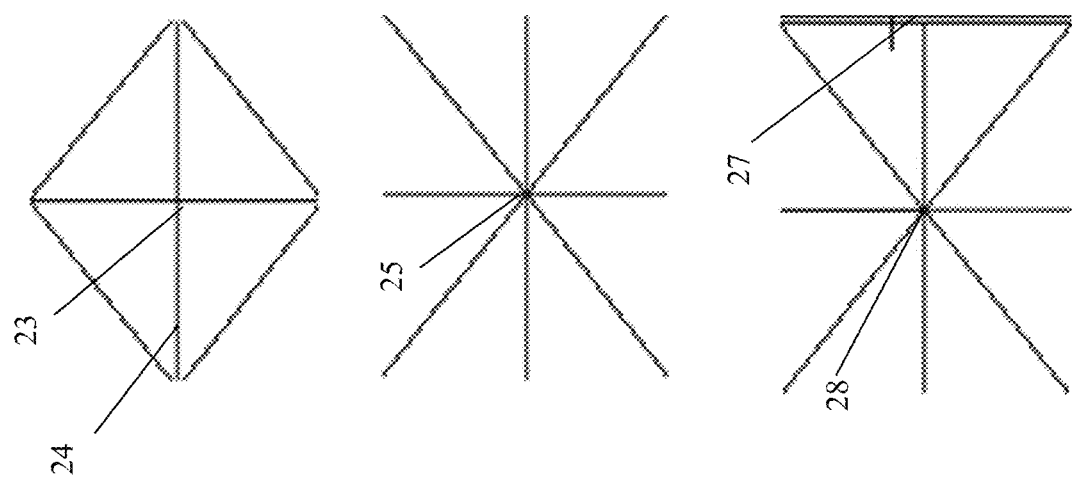
FIG. 3 is a graphical illustration of the system and method of the present embodiment in which points are selected for removal based on pre-selected criteria.

Referring now to FIG. 3, in the system and method of the present embodiment, (1) points are located for potential deletion, (2) an edge is selected to use for deletion evaluation, (3) the point is evaluated using the edge selected and pre-chosen criteria, and (4) the point and the line not selected in (2) are removed if the pre-selected criteria are satisfied. With respect to (1), points are located for potential removal if they are completely surrounded by right (90°) angles, either two along the edge or four within the interior. For example, point 23 is surrounded by four right angles. Point 23 could be valid for removal along with horizontal edge 24. Point 25 is surrounded by eight 45° angles, and is not valid for removal and will stay for the next iteration. Even though point 25 remains, edges connected to point 25 can be deleted because point 25 borders other points that are valid for removal. On the next iteration, point 25 will have four right angles left and will be a valid removal point. Point 27 is along the edge of the grid that is bordered by two right angles and thus is valid for removal. Point 28 is surrounded by eight 45° angles and is not a valid removal point.

Continuing to refer to FIG. 3, and with respect to (2), an edge is selected to use for deletion evaluation. An exemplary process for edge selection starts with initializing two iteration counters, I and E, to 0 and calculating $G=2^E$. For each right-angle point discovered in the mesh, the following computations are alternated, based on I. Alternative one begins with calculating $\alpha$ as the y coordinate of the point modulo 2*G. If $\alpha \leq G$ and $\alpha \neq 0$ then the edge orientation is vertical. If $\alpha > G$ or $\alpha = 0$, the edge orientation is horizontal. Alternative two begins with calculating $\alpha$ as the y coordinate of the point modulo 2*G and $\beta$ as the x coordinate of the point modulo 2*G. If $\alpha \leq G$ and $\alpha \neq 0$, and $\beta \leq G$ and $\beta \neq 0$ then the edge orientation is vertical. If $\beta > G$ or $\beta 32\ 0$, edge orientation is horizontal. If $\alpha > G$ or $\alpha = 0$, and if $\beta \leq G$ and $\beta \neq 0$, then the edge orientation is horizontal. If $\beta > G$ and $\beta = 0$, then the edge orientation is vertical. After orientations for all edges are found, (a) E is incremented if its modulo 2=0, (b) I is incremented, and (c) the above alternatives are repeated. Thus, the selected edge depends on the variables I, E, and G which vary based on the iteration of the process, and α and β which vary based on mesh location.

Continuing to still further refer to FIG. 3, and with respect to (3), a point is evaluated using the edge selected and pre-selected criteria. With respect to (4), a point is deleted if the difference between its value and the interpolation of its value along the line selected by the preceding process is found to be within pre-selected criteria. Between iterations of edge selection, after the edge orientation is determined for all potentially removable points, each point is evaluated along that edge using the pre-selected criteria with those satisfying the criteria removed. Any points that fail the criteria are removed as viable candidates for future iterations. Then all potential points for deletion are found again and the process executes another iteration. The process finally stops when no potential deletion points can be found (i.e., no points remain unchecked that are surrounded by right angles). The two neighbor points used to interpolate the value of the point in question are the neighbor points along this line. The line deleted if the point is deleted is the line along the opposite orientation. In the case of diagonal lines, a vertical orientation indicates the "/" orientation, and the horizontal orientation indicates the "\" orientation.

Figure 4A:
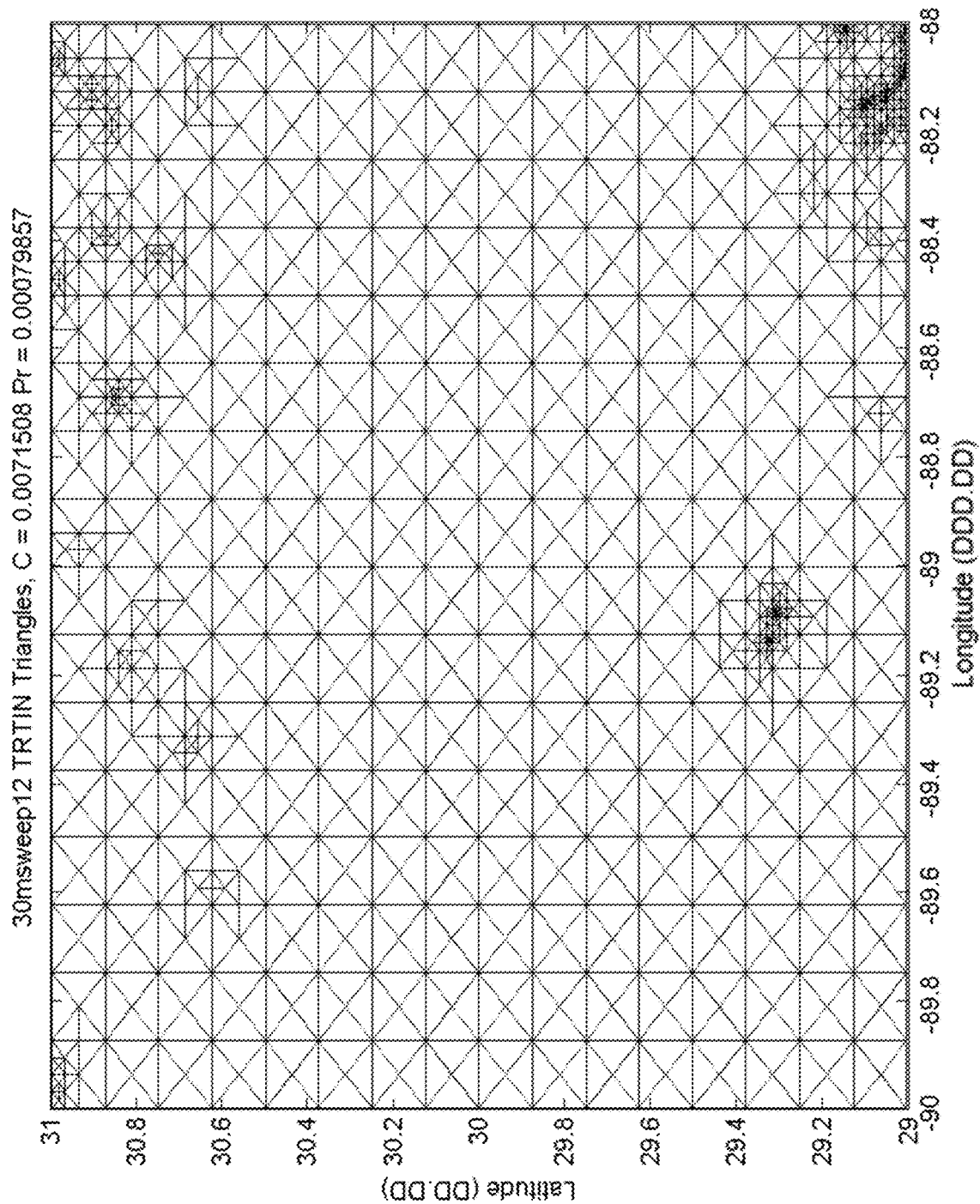
FIG. 4A is a graphical illustration of iteration 12 of a grid being thinned, with lines set for deletion in red, demonstrating how the orientation of removed lines vary with location in grid and iteration.
Figure 4B:
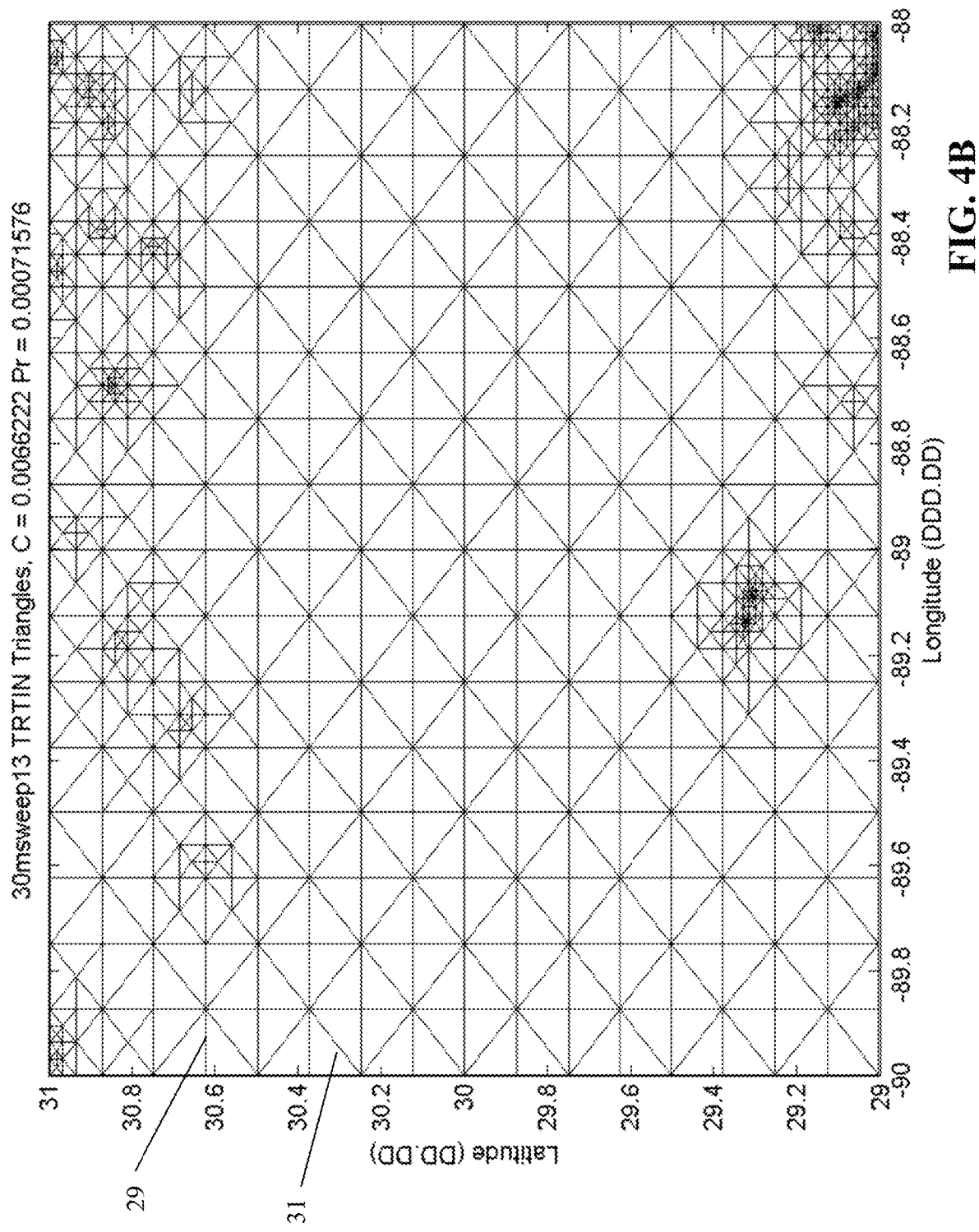
FIG. 4B is a graphical illustration of iteration 13 of the grid of FIG. 5A being thinned, with lines set for deletion in red, demonstrating how the orientation of lines vary with location in grid and iteration.

Referring now to FIGS. 4A and 4B, red lines 29 are edges that are being removed, black lines 31 are edges that are being left in place on successive iterations of the method of the present embodiment.

Referring now to FIG. 5, original grid 37 is shown before it is subjected to thinning rules 39 producing thinned grid 41. The western area of the data contains mostly flat areas with few features while the eastern side, particularly the fully populated area in the northeast has lots of variability.

Figure 6:
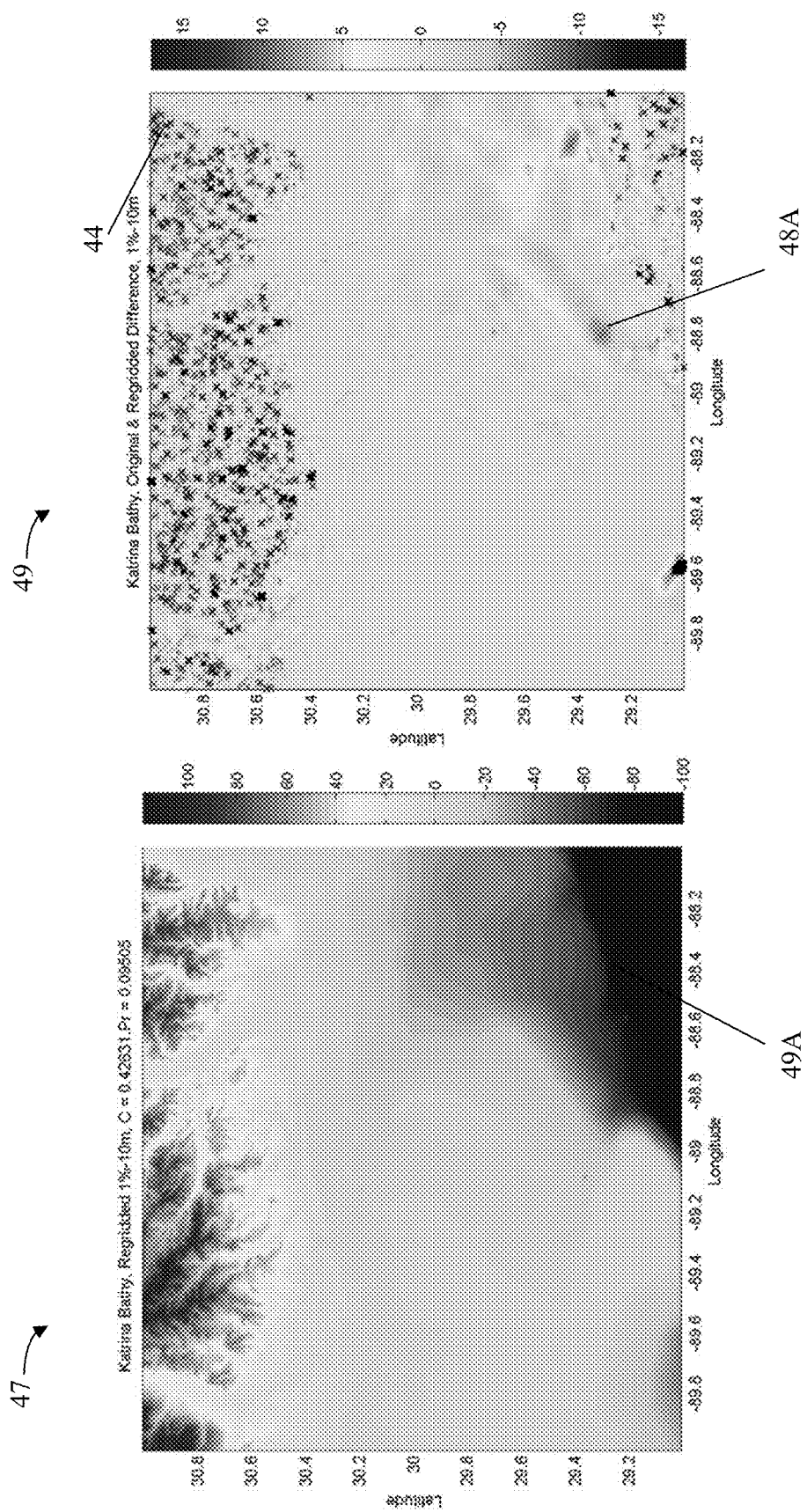
FIG. 6 is a graphical illustration of a color map of bathymetry for a regridded area accompanied by a color map of the residual difference between the original bathymetry and the regridded values.

Referring now to FIG. 6, graph 47 illustrates bathymetry of the thinned mesh according to the method of the present embodiment, while graph 49 illustrates the difference between the thinned mesh bathymetry and the original bathymetry. As can be seen most of data closely match, with the biggest differences 48A located in the deeper portions 49A of the data, with some sporadic spots in the shallower areas. Black X's 44 on graph 49 illustrate areas where the difference exceeds specified criteria, but do not reflect any areas of excessive variance.

Figure 7:
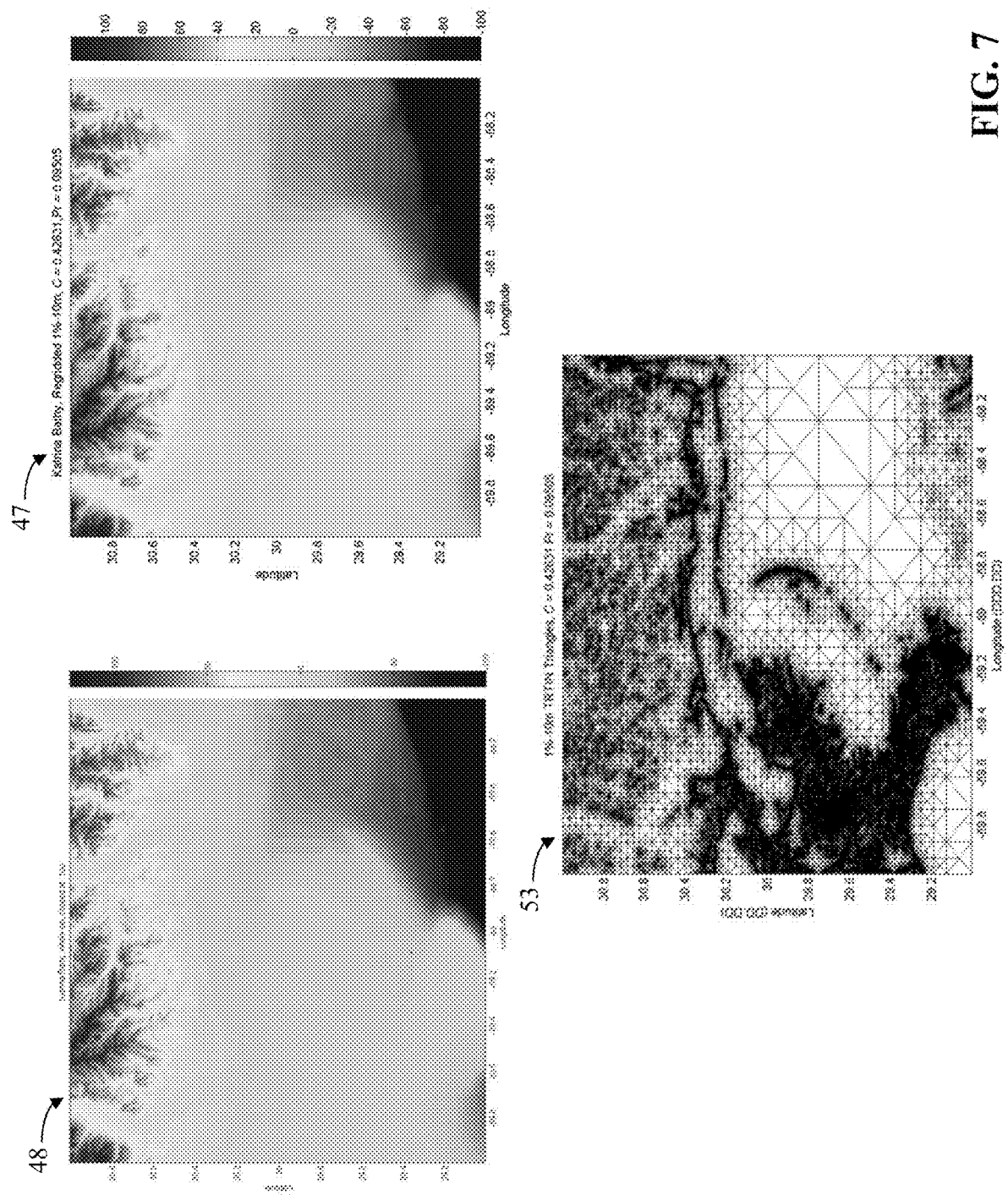
FIG. 7 is a graphical illustration of an original grid juxtaposed against a thinned grid and thinned RTIN.

Referring now to FIG. 7, original grid 48 is juxtaposed against thinned grid 47 and thinned RTIN 53. Thinning criteria applied against original grid 48 were 1% and 10 m. These criteria produced thinned grid 47 and thinned RTIN 53, reducing the size of thinned grid 47 to 10% of original grid 48 without appreciable loss of detail, as shown.

Figure 8:
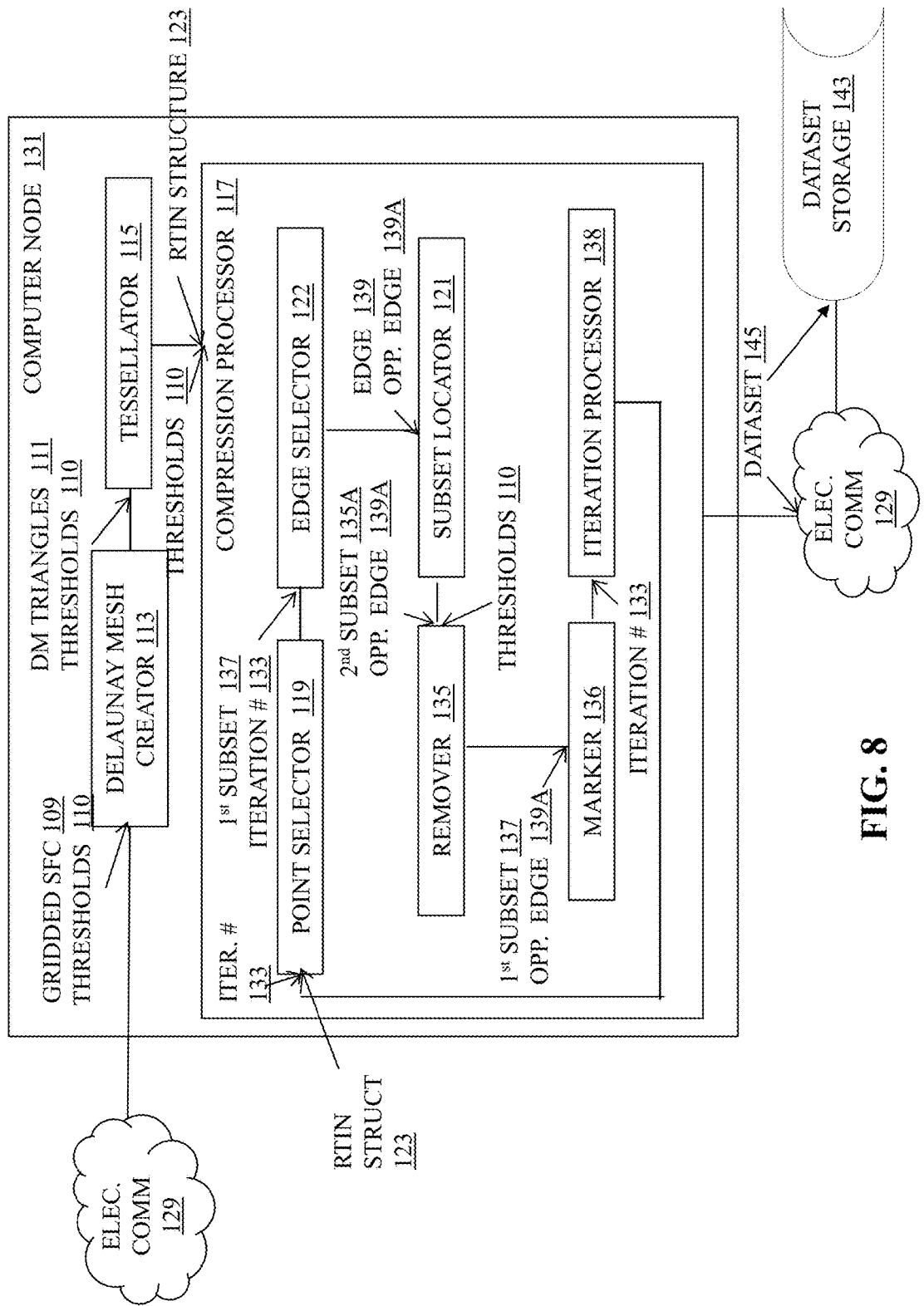
FIG. 8 is a schematic block diagram of an embodiment of the system of the present teachings.

Referring now to FIG. 8, system 100 for compressing electronic data can include, but is not limited to including, Delaunay mesh creator 113, executing on a special purpose computer, creating a Delaunay mesh from gridded surface 109 of the electronic data, the Delaunay mesh having resulting triangles 111. Delaunay mesh creator 113 can receive gridded surface 109 through, for example, electronic communications 129. Thresholds 110 can also be received by any of Delauney mesh creator 113, tessellator 115, or compression processor 117, for example, or by any other means, and from any source including a user or through a computation means. System 100 can also include tessellator 115, executing on the special purpose computer, tessellating resulting triangles 111 to form right-triangulated irregular network (RTIN) structure 123 being capable of being fully reduced to two triangles if the original grid possesses dimensionality of $2^n+1$ by $2^n+1$. The RTIN structure can include a plurality of points and a plurality of edges. System 100 can still further include compression processor 117 compressing, by the special purpose computer, the electronic data using RTIN structure 123 and pre-selected criteria (thresholds) 110. Compression processor 117 can reduce RTIN structure 123 by iterating, through iteration processor 138, for example, but not limited to, point selector 119, edge selector 122, subset locator 121, remover 135, and marker 136 using iteration number 133. Point selector 119, executing on the special purpose computer, can select a first subset of points 137 from the plurality of points in RTIN structure 123 based on angles that edges of the plurality of edges form with each of the plurality of points. Edge selector 122, executing on the special purpose computer, for each of the points in first subset 137, can select edge 139 from the plurality of edges for deletion evaluation based on iteration #133 and the selected point. Edge 139 can have opposing edge 139A of opposite orientation from edge 139. Subset locator 121, executing on the special purpose computer, can locate second subset 135A of the plurality of points. Second subset 135A can include the points of the plurality of points along selected edge 139. Remover 135, executing on the special purpose computer, can remove the selected point and opposing edge 139A if the points of the second subset meet the pre-selected criteria or thresholds 110. For each of the points in first subset 137, marker 136, executing on the special purpose computer, can mark the not-removed selected points as not available to be selected by point selector 119 during the next pass through the iteration of actions in compression processor 117. Among other actions required for computer iteration, iteration processor 138 can increment iteration number 133 and repeat execution of point selector 119, edge selector 122, subset locator 121, remover 135, and marker 136 until no points are found by point selector 119. When no points are found by point selector 119, dataset 145 can be created and can include numbers of x and y values in gridded surface 109, Δx and Δy of gridded surface 109, and the x/y/z values remaining after compression processor 117 completes its iteration. Dataset 145 can be stored, requiring much reduced storage area compared to gridded surface 109, in dataset storage 143, through, for example, electronic communications 129. An exemplary method to merge triangles 141 can include locating the bounding diamond of edges 139 surrounding point 137 to be removed, removing all edges 139 connected to the removed point 137, redrawing edge 137 connecting two remaining points of the bounding diamond based on a location within gridded surface 109 and iteration number 133. Pre-selected criteria or thresholds 110 can include the difference between a characteristic of a selected point and a linear interpolation of the characteristic at the selected point. The characteristic can include, for example, a distance metric specifying a flat value, the flat value flattening areas that vary less than the pre-selected criteria, a percentage metric specifying a dynamic value as a percentage of the characteristic of the selected point, and/or a gradient. Compression processor 117 can receive thresholds 110 from, for example, a user or any other means.

Figure 9:
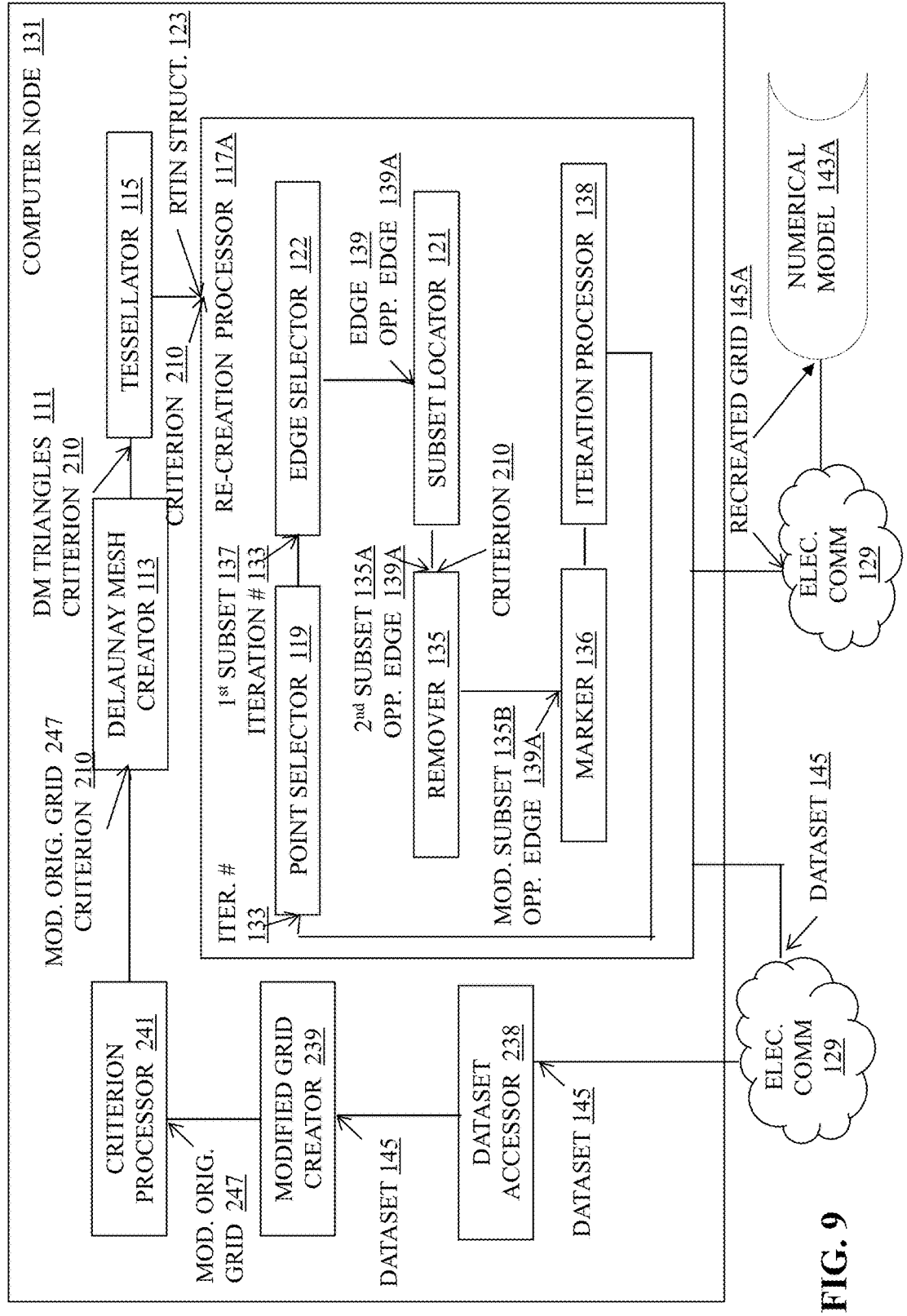
FIG. 9 is a schematic block diagram of an alternate embodiment of the system of the present teachings.

Referring to FIG. 9, in another embodiment, dataset 145 including the numbers of x and y values in an original grid, Δx and Δy of the original grid, and the x/y/z values remaining after thinning of the original grid according to the system and method of the present embodiment, can be processed to produce the original grid by regenerating Delaunay mesh triangle definitions. System 200 can include, but is not limited to including, dataset accessor 238 retrieving dataset 145, modified grid creator 239 beginning from an origin point, such as, for example, the point at the lower left corner of the grid, and creating modified original grid 247 by interpolating between the remaining x/y/z at Δx and Δy points for the numbers of x and y values in the original grid. Modified grid creator 239 can also flag points in modified original grid 247 that are added to modified original grid 247 that are not original x/y/z values. System 200 can include criterion processor 241 that sets criterion 210 to be based on the flagged points, i.e. to instruct re-creation processor 117A to removed the flagged points. Criterion processor 241 supplies modified original grid 247 to Delaunay mesh creator 113 to begin the process of thinning modified original grid 247 by removing the flagged points. Delaunay mesh creator 113 creates, by a special purpose computer, a Delaunay mesh from modified original grid 247. The Delaunay mesh provides resulting triangles 111 and criterion 210 to tessellator 115. Tessellator 115 tessellates, by the special purpose computer, resulting triangles 111 to form right-triangulated irregular network (RTIN) structure 123 which can be fully reduced to two triangles. RTIN structure 123 includes a plurality of points and a plurality of edges. Tessellator 115 provides criterion 210 and RTIN structure 123 to re-creation processor 117A which recreates, by the special purpose computer, the original grid using RTIN structure 123 and pre-selected criterion 210. Re-creation processor 117A can include, but is not limited to including point selector 119 selecting first subset 137 of points from the plurality of points based on angles that edges of the plurality of edges form with each of the plurality of points. Point selector 119 provides first subset 137 to edge selector 122 which selects for each of the points in first subset 137, one of the plurality of edges for deletion evaluation based on iteration number 133 and the one of each of the points (the selected point), the selected edge 139 having opposing edge 139A of opposite orientation from selected edge 139. Edge selector 122 provides edge 139 and opposing edge 139A to subset locator 121 which locates second subset 135A of the plurality of points, second subset 135A includes the points of the plurality of points along selected edge 139. Subset locator 121 provides second subset 135A and opposing edge 139A to remover 135 which removes, for each of the points in first subset 137, the point and the opposing edge if the points of second subset 135A meet pre-selected criterion 210. Remover 135 provides modified subset 135B and opposing edge 139A to marker 136 which, for each of the points in first subset 137 not removed previously, marks the not-removed points as not available to be selected by point selector 119. Marker 136 returns execution control to iteration processor 138 which, among other things, increments iteration number 133 and invokes point selector 119 until no points are found. Re-creation processor can provide re-created grid 145A to numerical model 143A, for example, through electronic communications 129, among other ways. The original triangle definitions are thus recreated.

Figure 10A:
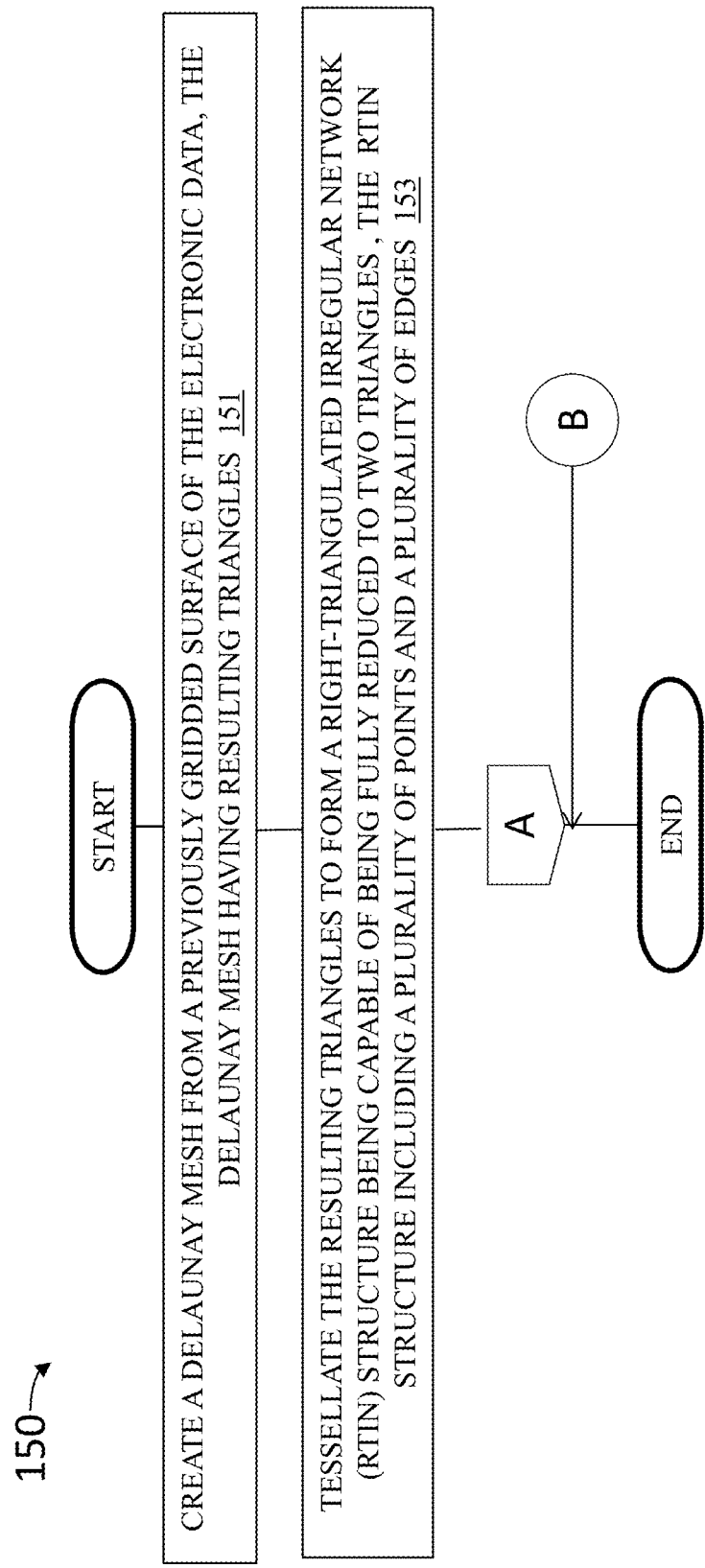
FIGS. 10A and 10B are flowcharts of an embodiment of the method of the present teachings.
Figure 10B:
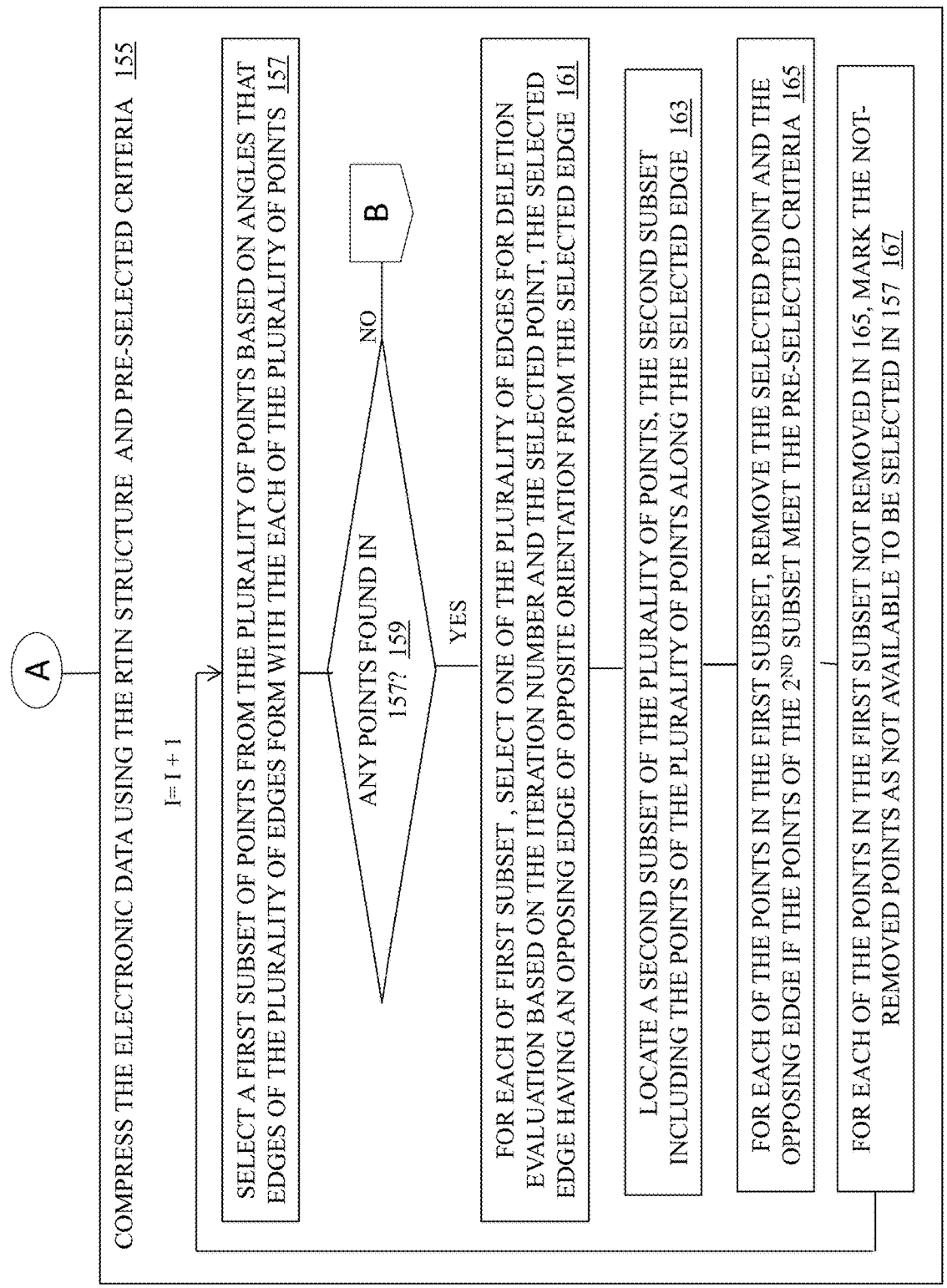

Referring now to FIGS. 10A and 10B, method 150 for compressing electronic data can include, but is not limited to including, creating 151, by a special purpose computer, a Delaunay mesh from a previously gridded surface of the electronic data, the Delaunay mesh having resulting triangles, and tessellating 153, by the special purpose computer, the resulting triangles to form a right-triangulated irregular network (RTIN) structure being capable of being fully reduced to two triangles, the RTIN structure including a plurality of points and a plurality of edges. System 200 can also include compressing 155, by the special purpose computer, the electronic data using the RTIN structure and pre-selected criteria including: (a) incrementing an iteration number, (b) selecting 157 a first subset of points from the plurality of points based on angles that edges of the plurality of edges form with each of the plurality of points, (b) if 159 there are points found in the (b), and (c) selecting 161, for each of the points in the first subset, one of the plurality of edges for deletion evaluation based on the iteration number and the selected point, the selected edge having an opposing edge of opposite orientation from the selected edge. Method 150 can also include (d) locating 163 a second subset of the plurality of points, the second subset including the points of the plurality of points along the selected edge, (e) for each of the points in the first subset, removing 165 the selected point and the opposing edge if the points of the second subset meet the pre-selected criteria, and (f) for each of the points in the first subset not removed in (e), marking 167 the not-removed points as not available to be selected in (b), and (g) repeating (a) through (f) until no points are found in (b).

Figure 11A:
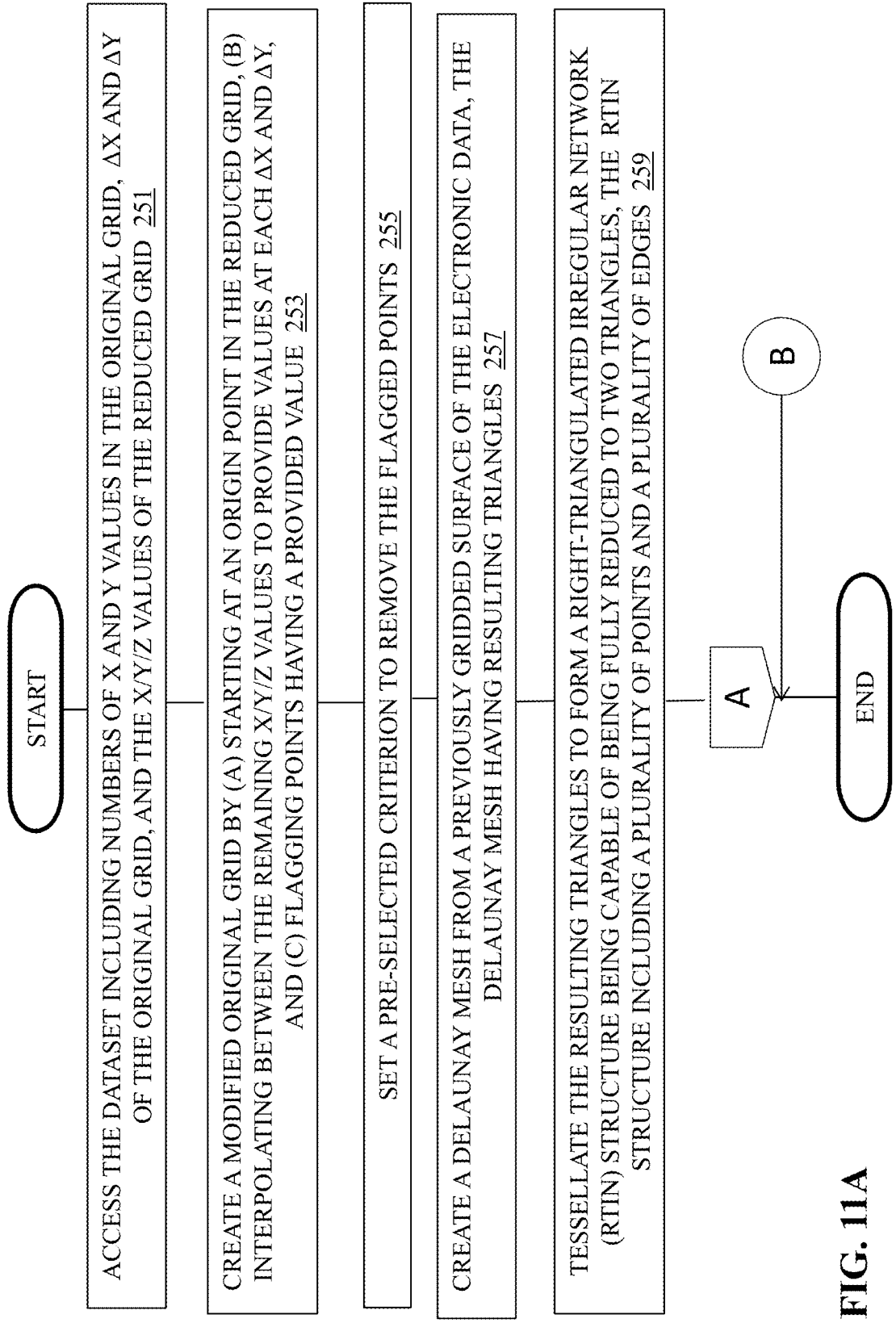
FIGS. 11A and 11B are flowcharts of an embodiment of the method of the present teachings.
Figure 11B:
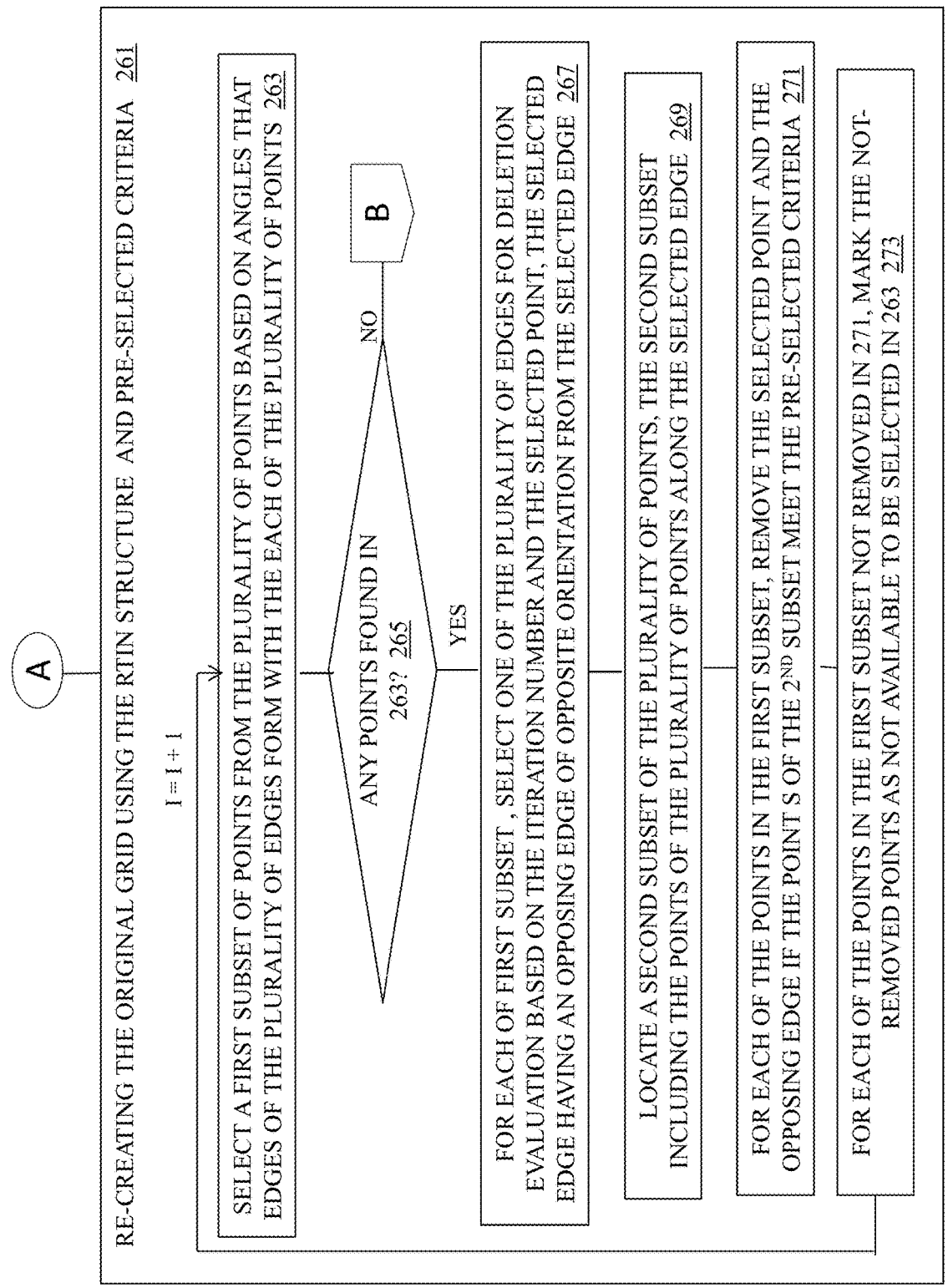

Referring now to FIGS. 11A and 11B, in another embodiment, method 250 for re-creating an original encrypted latitude/longitude grid of geospatial data from a dataset compressed according to a bottom-up RTIN method can include, but is not limited to including, accessing 251 the dataset including numbers of x and y values in the original grid, Δx and Δy of the original grid, and the x/y/z values of the dataset, creating 253 a modified original grid by (a) starting at an origin point in the dataset, (b) interpolating between the remaining x/y/z values to provide values at each Δx and Δy, and (c) flagging points having a provided value, and setting 255 a pre-selected criterion to remove the flagged points. Method 250 can also include creating 257, by a special purpose computer, a Delaunay mesh from the modified original grid, the Delaunay mesh having resulting triangles, and tessellating 259, by the special purpose computer, the resulting triangles to form a right-triangulated irregular network (RTIN) structure being capable of being fully reduced to two triangles, the RTIN structure including a plurality of points and a plurality of edges. System 250 can still further include re-creating 261, by the special purpose computer, the original grid using the RTIN structure and the pre-selected criterion including: (a) incrementing an iteration number, (b) selecting 263 a first subset of points from the plurality of points based on angles that edges of the plurality of edges form with each of the plurality of points. If 265 there are points found in 263, (c) selecting 267 one of the plurality of edges for deletion evaluation based on the iteration number and the selected point, the selected edge having an opposing edge of opposite orientation from the selected edge, and (d) locating 269 a second subset of the plurality of points, the second subset including the points of the plurality of points along the selected edge. Method 250 can further include (e) for each of the points in the first subset, removing 271 the point and the opposing edge if the points of the second subset meet the pre-selected criteria, (f) for each of the points in the first subset not removed in (e), marking 273 the not-removed points as not available to be selected in (b), and (g) repeating 265 (a) through (f) until no points are found in (b).

Figure 12A:
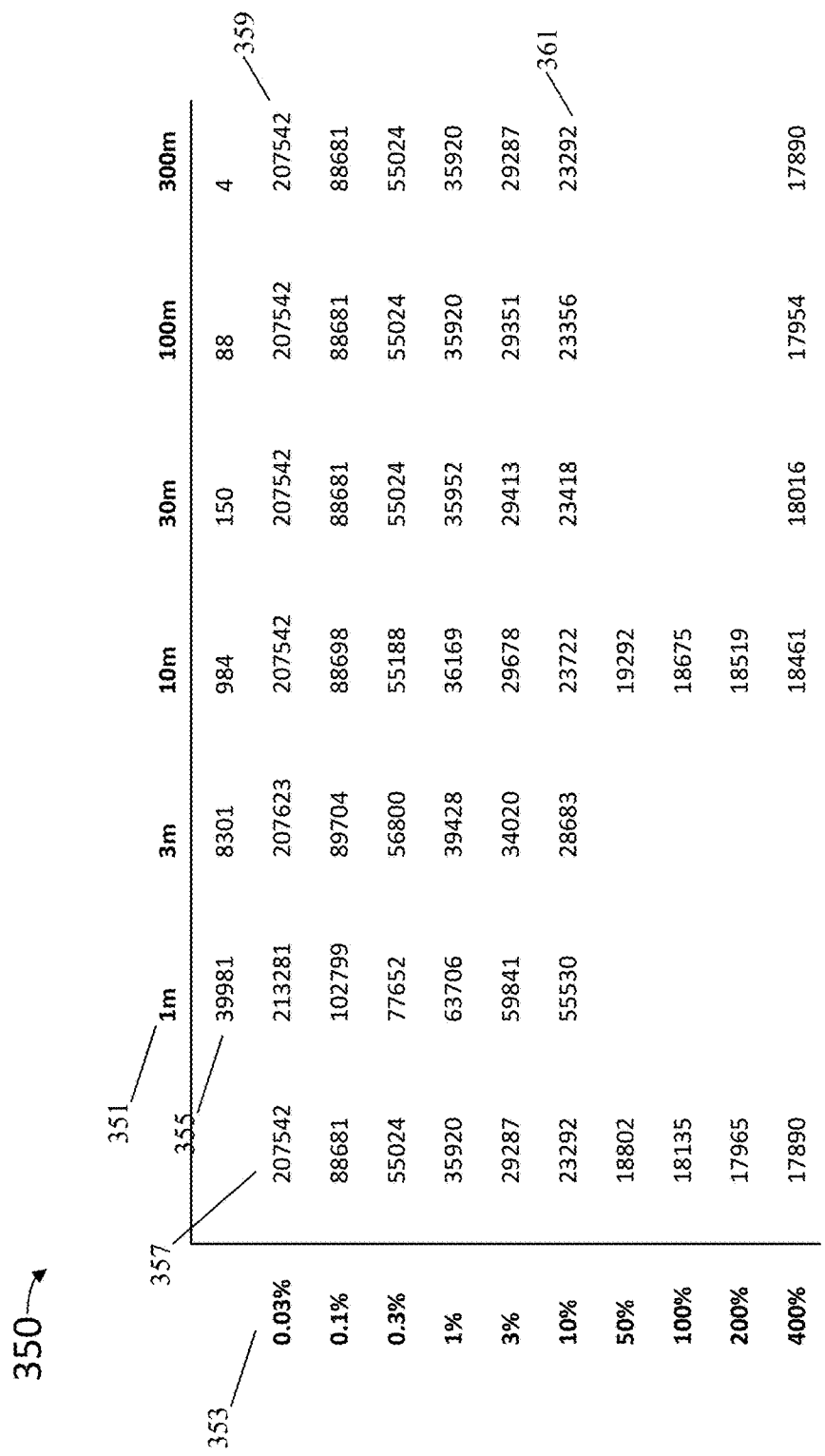
FIG. 12A is a table of RTIN thinning results of the Hurricane Ike source grid that has 1,050,625 numeric depth values.

Referring now to FIG. 12A, table 350 shows thinned RTIN thinning results using a Hurricane Ike source grid that has 1,050,625 numeric depth values. Row 351 illustrates a fixed distance metric and column 353 illustrates the % of the depth metric used for each test. Table 350 entries are the number of points retained after thinning. Row 355 indicates fewer retained points as the fixed metric of row 351 is increased. Column 357 indicates that as the percent metric of column 353 is increased, the number of points retained decreases. The number of points retained when both metrics are combined is typically not the sum of the points retained using each metric independently. For example, the 10 m metric retained 984 pts and the 10% metric retained 23,292 points for a sum of 24,276 points, while the combined metric test retained 23,722 points. Depending on the values of the two metrics, and of course the characteristics of the data set, one parameter or the other may dominate. In row 359, the % metric in column 353 dominates the result until the fixed metric in row 351 gets quite small. In row 361, the % metric dominates only for the very large fixed metric. Referring now to FIG. 12B, shown are the percentages of the original number of points remaining after thinning according to the system and method of the present teachings.

Embodiments of the present teachings are directed to computer systems such as system 100 (FIG. 8) and system 200 (FIG. 9) for accomplishing the methods such as method 150 (FIGS. 10A and 10B) and method 250 (FIGS. 11A and 11B) discussed in the description herein, and to computer readable media containing programs for accomplishing these methods. The raw data and results can be stored for future retrieval and processing, printed, displayed, transferred to another computer, and/or transferred elsewhere. Communications links such as electronic communications 129 (FIG. 8) can be wired or wireless, for example, using cellular communication systems, military communications systems, and satellite communications systems. In an exemplary embodiment, the software for the system is written in FORTRAN and C. The system can operate on a computer having a variable number of CPUs. Other alternative computer platforms can be used. The operating system can be, for example, but is not limited to, LINUX®.

The present embodiment is also directed to software for accomplishing the methods discussed herein, and computer readable media storing software for accomplishing these methods. The various modules described herein can be accomplished on the same CPU, or can be accomplished on different computers. In compliance with the statute, the present embodiment has been described in language more or less specific as to structural and methodical features. It is to be understood, however, that the present embodiment is not limited to the specific features shown and described, since the means herein disclosed comprise preferred forms of putting the present embodiment into effect.

Methods such as methods 150 (FIGS. 10A and 10B) and method 250 (FIGS. 11A and 11B) of the present embodiment can be, in whole or in part, implemented electronically. Signals representing actions taken by elements of the system and other disclosed embodiments can travel over at least one live communications network 129 (FIG. 8). Control and data information can be electronically executed and stored on at least one computer-readable medium. System 100 (FIG. 8) and system 200 (FIG. 9) can be implemented to execute on at least one computer node in at least one live communications network 129 (FIG. 8). Common forms of at least one computer-readable medium can include, for example, but not be limited to, a floppy disk, a flexible disk, a hard disk, magnetic tape, or any other magnetic medium, a compact disk read only memory or any other optical medium, punched cards, paper tape, or any other physical medium with patterns of holes, a random access memory, a programmable read only memory, and erasable programmable read only memory (EPROM), a Flash EPROM, or any other memory chip or cartridge, or any other medium from which a computer can read. Further, the at least one computer readable medium can contain graphs in any form including, but not limited to, Graphic Interchange Format (GIF), Joint Photographic Experts Group (JPEG), Portable Network Graphics (PNG), Scalable Vector Graphics (SVG), and Tagged Image File Format (TIFF).

3. Grid Retaining Irregular Network (GRIN) in 3 Dimensions (3D)

In an embodiment, the Grid Retaining Irregular Network (GRIN) detriangulation method of compression results in a broader error distribution than that in other techniques, allowing growth of cumulative error while maintaining the maximum error below the user defined threshold. Embodiments of the present disclosure provide extensions of GRIN (e.g., GRIN3D) in three dimensional space (e.g., extensions to handle 3D data sets). Thinning of large 3D geospatial datasets is a critical technology for many applications (e.g., for delivering forecasts to fleets).

In an embodiment, systems, devices, and methods using GRIN in 3D can process NaNs (Not a Number) (e.g., according to the IEEE 754 standard). For example, in an embodiment, GRIN can be used to properly recognize and handle IEEE Standard "NaNs" (Not a Number) which are used to represent land areas in oceanographic and atmospheric model netCDF datasets. Further, in an embodiment, GRIN can be used to automatically process a sequence of 2D layers within a 3D data set.

3.1. Keep List

Embodiments of the present disclosure have several advantages over prior techniques. For example, in an embodiment, a "keep" list can be used to take advantage of GRIN's broader error distribution. In an embodiment, bi-directional point elimination criteria can be used to reduce the keep list size. In an embodiment, NaN thinning—elimination of "interior" points of NaN clusters—can be used to reduce the number of points. In an embodiment, a compact encoding approach can be used for sparse, detriangulated grids. In an embodiment, NaN replacement approaches with "row" and "layer" mean values can be used to maximize compression for high-NaN content datasets by minimizing land/water transitions.

For example, systems and methods using GRIN techniques without a keep list in accordance with an embodiment of the present disclosure could have a small number of points as "outliers" (e.g., typically <<1% of the total number of grid points). For example, in an embodiment, outliers are regridded points that exceeded the specified error threshold (e.g., in an embodiment, with a maximum of x2). Outliers can occur due to the recursive nature of the GRIN algorithm.

In an embodiment, outliers can be eliminated by reducing the error threshold. In an embodiment, reducing the error threshold to eliminate outliers can come at the cost of reducing compression. Testing revealed that replacing these points with their original value yielded better accuracy.

FIG. 13 is a flowchart of a method for generating a keep list in accordance with an embodiment of the present disclosure. In step 1302, a unique index number is produced for every point within the data mesh. For example, in an embodiment, the unique index numbers can be assigned starting at the lower left corner with 0 and incrementing by 1 as the data mesh is traversed from left to right. Thus, in an embodiment, the leftmost point of the second bottommost row would be equal to one more than the width of the data mesh as a whole.

In step 1304, a determination is made whether a difference between each point in the mesh and a corresponding point in the original data set exceeds an error threshold. For example, in an embodiment, given both the thinned results of the GRIN algorithm and the source file the data originates from, each point can be compared against an arbitrary user specified error threshold value. In step 1306, if the absolute difference between the GRIN produced mesh and the original data set differs by a value greater than the user specified value, the computed index value of the point and the value of that point in the original source data set can be recorded.

By generating a keep list (e.g., according to the method of FIG. 13), a list of points whose errors exceed a user defined threshold can be created, and the keep list can be used to identify when original values for points should be used. For example, when querying the GRIN produced data mesh for a point's value, a user, software program, and/or device using GRIN can first check to see if the point is specified within the keep list via lookup by the computed point's index value and can utilize the original value if the point is specified within the keep list.

3.2. Bi-Directional Point Elimination Criteria

Systems and methods using GRIN techniques without bi-directional point elimination criteria in accordance with an embodiment of the present disclosure can, for example, analyze point triplets along diagonals transversed through the data grid, eliminating the center point if it met the criteria. FIG. 14A is a diagram illustrating point triplets in accordance with an embodiment of the present disclosure. In FIG. 14A, exemplary point triplets 1402 and 1402 have ovals drawn encircling them. In an embodiment, a disadvantage of this approach is that a point could be eliminated along one diagonal (e.g., a diagonal for triplet 1402) that should have been kept based on the test for the other diagonal (e.g., a diagonal for triplet 1404). This can result in the difference between the regridded point and the original point at that location exceeding the error threshold.

Systems and methods using GRIN in accordance with embodiments of the present disclosure (e.g., GRIN3D) can perform bi-directional elimination checking, which reduces the size of the keep list and thus improves compression (e.g., checking along diagonal for triplet 1402 and diagonal for triplet 1404). For example, when considering a point for deletion, systems and methods in accordance with embodiments of the present disclosure can examine the resulting interpolated length both along the axis that will remain and along the axis that will be removed if the deletion proves valid. In an embodiment, this reduces the number of deletions where the replaced value exceeds the user defined thinning metric, and overall improves the accuracy of the results.

FIG. 14B is a flowchart of a method for bi-directional point elimination analysis in accordance with an embodiment of the present disclosure. In step 1406, a first resulting interpolated length along an axis that will remain after the selected point is deleted is determined. In step 1408, a determination is made whether a first difference between the first resulting interpolated length and a first corresponding length in the mesh exceeds an error threshold. In step 1410, a second resulting interpolated length along is determined an axis that will be removed after the selected point is deleted. In step 1412, a determination is made whether a second difference between the second resulting interpolated length and a second corresponding length in the mesh exceeds the error threshold. In step 1414, the point is removed if neither the first difference nor the second difference exceeds the error threshold.

3.3. NaN Thinning

Systems and methods using GRIN techniques without NaN thinning (e.g., elimination of "interior" points of NaN clusters) in accordance with an embodiment of the present disclosure could automatically skip point triplets where any one of the points was NaN (not a number) valued, as no valid comparisons or averaging could be made. Thus, without NaN thinning, NaN points can be treated as uncompressible, and datasets with high numbers of NaN could suffer in compression due to possessing points that could not be removed. NaN points can often be clustered together in large contiguous chunks, however (e.g., land regions could be a common source of their presence for water-based data sets).

Systems and methods in accordance with embodiments of the present disclosure can remove NaN valued points if every other point within the compared point triplets is also NaN valued, allowing for near-maximal point reduction within large contiguous NaN chunks within the dataset, removing large clusters of previously uncompressible points.

For example, when considering a point for deletion, systems and methods in accordance with embodiments of the present disclosure can examine all of the adjacent neighbor points. In an embodiment, if all 2 or 4 (depending on the point's location either along the edge or within the interior) are NaN, as is the point itself, then the point can be removed regardless of other criteria considerations. In an embodiment, the resulting hole in the mesh can be stitched back together as if the point had been removed via normal point removal methods.

3.4. NaN Replacement

In an embodiment, NaN replacement approaches with "row" and "layer" mean values can be used to maximize compression for high-NaN content datasets (e.g., by minimizing land/water transitions). For example, NaN values can result from geographic transitions between areas of data (e.g., water) and not data (e.g., land), which can have an impact on compression algorithms similar to step changes in values or high frequency content. Depending upon the geospatial characteristics of the dataset (dynamic range, frequency content, etc.), replacement of NaN values with alternative synthetic "real" values can yield greater compression over the independent NaN thinning approach. Systems and methods in accordance with embodiments of the present disclosure can replace NaN value(s) with mean values for a row and/or layer containing the NaN value(s) to improve compression for high-NaN content datasets.

3.5. Compact Encoding Format/Layer Stacking

Systems and methods in accordance with embodiments of the present disclosure can use a compact encoding format and/or layer stacking to improve compression performance. FIG. 15 is a flowchart of an exemplary method for compact encoding in accordance with an embodiment of the present disclosure.

In step 1502, the maximal X and Y extents of a grid are determined. For example, in an embodiment, the actual double values of the X and Y coordinates of the origin (taken to mean the bottom leftmost point in the grid) and the spacing between points along both the X and Y axes (e.g., also a double) are recorded. These values can be held to be constant in any stacked set of GRIN layers and act as header values for the produced datacube as a whole. In an embodiment, GRIN layers with differing values in these properties cannot be stacked together.

In an embodiment, for each layer to be inserted into a GRIN datacube, a layer specific header can be created by recording the integer number of points in the layer (e.g., excluding nulls), the integer number of null points retained in the layer, and, if a Keep List is being kept separately, the integer number of the Keep List's size. In an embodiment, the double value of the maximum and minimum z values observed throughout the mesh is also recorded.

In an embodiment where unsigned shorts and unsigned integers are used, a Boolean can be recorded indicating whether the following list of point indices are recorded as unsigned shorts or unsigned integers, determined as whether the difference between the computed indices of any two adjacent points exceeds the maximal value of an unsigned short (e.g., 65535).

In step 1504, a difference between a computed single value index of every remaining point and the point that immediately preceded them is determined. For example, in an embodiment, the difference between the computed single value index of every remaining point and the point that immediately preceded them is recorded (e.g., as either an unsigned short or an unsigned integer). For example, if a set of points were 0, 1, and 2, the index values could be recorded as 0, 1, 1.

In an embodiment, the same process is repeated (e.g., in an embodiment, first with a Boolean indicating whether unsigned shorts or unsigned integers are used, then with the differences between the computed single point index values) for all NaN and keep list points. In an embodiment, even if there are no NaN or keep list points present, a Boolean can still be written to ensure proper file positions. In an embodiment, in each of the cases, a number of indices should be written to equal the number of points previously recorded.

In step 1506, z values for each retained point are determined as a percentage of the range of z values within the layer. For example, in an embodiment, after all indices are stored, each retained point's z value can be computed as a percentage of the range of z values seen within the layer, with 0 representing the minimum value present and 1 representing the maximum.

In step 1508, the z values are encoded based on the number of indices. For example, in an embodiment, the determined z values can be multiplied by 32767, effectively splitting all z values in the layer into 32767 "buckets." In an embodiment, the difference between each point's computed "bucket" and the previous point's can be recorded (e.g., in an embodiment, using an alternating zigzag encoding to handle writing negative numbers using an unsigned variable). In an embodiment, a number of thus encoded z values are written equal to the number of indices indicated in the layer header. In an embodiment, no z values are stored for the null points, as they are known to possess NaN values, so following the z values of the remaining points are the z values of the keep list points, when those points are kept separate.

4. Exemplary Embodiments

Embodiments of the present disclosure can be implemented using hardware, software, and/or a combination of hardware and software. Further, embodiments of the present disclosure can be implemented using a single device (e.g., a single chip) or multiple devices. Embodiments of the present disclosure can be implemented as one or more standalone devices or implemented into one or more host devices. In an embodiment, a method according to an embodiment of the present disclosure is implemented using software executing on a computing device (e.g., including a processor and memory). In an embodiment, a method according to an embodiment of the present disclosure is implemented using software executing on a compressor device (e.g., a data compressor device) that includes a processor and a memory. In an embodiment, a computing device and/or a data compressor that is used to implement an embodiment of the present disclosure can be a special purpose device (e.g., a special purpose computing device and/or a special purpose compressor device).

FIG. 16 is a diagram of an exemplary system that compresses and decompresses data in accordance with an embodiment of the present disclosure. FIG. 16 includes a computing device 1602 that communicates with three end user devices 1614 via a data router 1612. In FIG. 16, computing device 1602 includes a data compressor 1604, processor 1606, and memory 1608, and end user devices 1614 include respective data compressors 1616, processors 1618, and memories 1620.

The communication links between computing device 1602 and data router 1612 and between data router 1612 and each of end user devices 1614 can be wired or wireless communication links and long range or short range communication links in accordance with embodiments of the present disclosure. In an embodiment, the communication link between computing device 1602 and data router 1612 and between data router 1612 and each of end user devices 1614 can be low bandwidth communication links. For example, in an embodiment, data router 1612 is a satellite and has low bandwidth upload and download communication links to and from computing device 1602 and end user devices 1614.

In an embodiment, computing device 1602 is configured to compress data (e.g., using data compressor 1604) prior to sending data to data router 1612 (e.g., due to the low bandwidth link between computing device 1602 and data router 1612). In an embodiment, the data sent from computing device 1602 can include destination information instructing data router 1612 where to route the information (e.g., specifying sufficient routing information for data router 1612 to route the information to one of end user devices 1614). In an embodiment, data router 1612 is configured to send data (e.g., based on the routing information) to a specified end user device (e.g., end user device 1614*a*). In an embodiment, the receiving end user device (e.g., end user device 1614*a*) is configured to decompress the received data (e.g., using data compressor 1616*a*) so that the decompressed data can be more easily processed.

Data compressor 1604 of computing device 1604 and data compressors 1616 of end user devices 1614 can be configured to perform data compression, data decompression, or data compression and data decompression in accordance with embodiments of the present disclosure. For example, in an embodiment, end user device 1614*b* can use data compressor 1616*b* to compress data and send it to computing device 1602 (via data router 1612). In an embodiment, computing device 1602 can decompress the received data (e.g., using data compressor 1604).

FIG. 17 is a diagram of another exemplary system that compresses and decompresses data in accordance with an embodiment of the present disclosure. In FIG. 17, data gathering devices 1702 gather data (e.g., climatological data) and send the gathered data, via a satellite 1712, to a computing center 1714 to be processed (e.g., by a supercomputer 1716 that includes a data compressor 1718, a processor 1720, and a memory 1722). Data gathering devices 1702 can include a variety of devices, including, but not limited to, satellites(s) 1704 (e.g., sensing climatological data from space), buoy(s) 1706 (e.g., measuring currents and/or temperatures of water), and ship(s) 1708 (e.g., via onboard sensors for measuring currents and/or temperatures of water).

In an embodiment, one or more of data gathering devices 1702 (e.g., satellite(s) 1704, buoy(s) 1706, and/or ship(s) 1708) include data compressors 1710. In an embodiment, data gathering devices 1702 do not include data compressors 1710. In an embodiment, the communication link between data gathering devices 1702 and satellite 1712 and/or the communication link between satellite 1712 and computing center 1714 are low bandwidth communication links, and data from one or more of data gathering devices 1702 is compressed (e.g., using data compressors 1710) before it is transmitted to satellite 1712. In an embodiment, data gathering devices 1702 transmit uncompressed data to satellite 1712. Data transmitted from data gathering devices 1702 can include destination information instructing satellite 1712 where to transmit data (e.g., identifying location information for computing center 1714 and/or supercomputer 1716).

In an embodiment, supercomputer 1716 of computing center 1714 receives the data from satellite 1712 and processes the data. In an embodiment, supercomputer 1716 gathers and processes a large amount of data that cannot be easily transmitted to end user devices (e.g., ships 1726) and compresses the data for easier transmission (e.g., using data compressor 1718). For example, in an embodiment, supercomputer 1716 gathers climatological data from a variety of sources (e.g., from satellite(s) 1704, buoy(s) 1706, and/or ship(s) 1708) and generates a forecast. In an embodiment, supercomputer 1716 compresses the forecast data, using data compressor 1718, and sends it to one or more of ships 1726 via satellite 1724. In an embodiment, the communication link between computing center 1714 and satellite 1724 and the communication link between satellite 1724 and ships 1726 are low bandwidth communication links. In an embodiment, each of ships 1726 includes a data compressor 1728, a processor 1730, and a memory 1732.

Data compressors 1604, 1616, 1710, 1718, and 1728 can be implemented using hardware, software, and/or a combination of hardware and software in accordance with embodiments of the present disclosure. Further, data compressors 1604, 1616, 1710, 1718, and 1728 can be implemented using a single device (e.g., a single chip) or multiple devices. Data compressors 1604, 1616, 1710, 1718, and 1728 can be integrated into a host device (e.g., integrated into computing device 1602, end user device 1614, satellite 1704, buoy 1706, ship 1708, supercomputer 1716, and/or ships 1726).

In an embodiment, data compressors 1604, 1616, 1710, 1718, and 1728 can be implemented as standalone (e.g., special purpose) devices. In an embodiment, data compressors 1604, 1616, 1710, 1718, and 1728 can include one or more processors and/or memories. In an embodiment, computing device 1602 can be a data compressor device, and data compressor 1604 can be hardware or software (stored within memory 1608 or outside of memory 1608) for performing data compression and/or decompression functions. In an embodiment data router 1612, satellite 1712, and/or satellite 1724 can also include data compressors, such as data compressors 1604, 1616, 1710, 1718, and 1728.

In an embodiment, data compressors 1728 can be configured to compress, decompress, or compress and decompress data. For example, in an embodiment, supercomputer 1716 transmits compressed forecast data to ship 1726a to satellite 1724 and includes destination information for ship 1726a. In an embodiment, satellite 1724 relays the data to ship 1726a, and ship 1726a decompresses the compressed forecast data using data compressor 1728a so that the decompressed forecast data can be used by ship 1726a.

While data compressors in accordance with embodiments of the present disclosure have been described above with reference to embodiments with computing devices (e.g., computing device 1602) and end user devices (e.g., end user devices 1614) supercomputers (e.g., supercomputer 1716), and ships (e.g., ships 1726), it should be understood that data compressors in accordance with embodiments of the present disclosure can be used in a wide variety of systems, methods, and devices.

Embodiments of the present disclosure provide systems and methods to enable data compressors 1604, 1616, 1710, 1718, and 1728 to compress and/or decompress data more effectively (e.g., more efficiently and/or with fewer errors due to data compression and/or decompression). For example, embodiments of the present disclosure provide systems and methods to enable data compressors 1604, 1616, 1710, 1718, and 1728 to use GRIN and/or GRIN3D algorithms to compress data more effectively (e.g., more efficiently and with fewer errors due to data compression and/or decompression).

5. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Any representative signal processing functions described herein can be implemented using computer processors, computer logic, application specific integrated circuits (ASIC), digital signal processors, etc., as will be understood by those skilled in the art based on the discussion given herein. Accordingly, any processor that performs the signal processing functions described herein is within the scope and spirit of the present disclosure.

The above systems and methods may be implemented as a computer program executing on a machine, as a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g., software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present disclosure.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A method for compressing data, the method comprising:
   forming, using a compressor device, a mesh based on the data, wherein the mesh comprises a plurality of triangles;
   tessellating, using the compressor device, the plurality of triangles to form a right-triangulated irregular network (RTIN) structure being capable of being fully reduced to two triangles, the RTIN structure including a plurality of points and a plurality of edges;
   compressing, using the compressor device, the data using the RTIN structure;
   producing, using the compressor device, a unique index number for every point within the RTIN structure;
   determining, using the compressor device, whether a difference between each point in the RTIN structure and a corresponding point in the data exceeds an error threshold; and
   for each point in the RTIN structure, if the difference between the point and the corresponding point in the data exceeds the error threshold, record the computed index value of the point in the RTIN structure and the value of that point in the data in a keep list.

2. The method of claim 1, wherein the mesh is a Delaunay mesh.

3. The method of claim 1, further comprising:
   receiving a query for a value of a queried point in the RTIN structure;
   determining whether an index value of the queried point is in the keep list; and
   returning a keep list value of the queried point in the keep list if the index value of the queried point is in the keep list.

4. The method of claim 3, further comprising:
   returning a value of the queried point in the RTIN structure if the index value of the queried point is [M] not in the keep list.

5. The method of claim 1, wherein compressing the data further comprises:
   (a) incrementing an iteration number;
   (b) selecting a first subset of points from the plurality of points based on angles that edges of the plurality of edges form with the each of the plurality of points;
   (c) for each of the points in the first subset, selecting one of the plurality of edges for deletion evaluation based on the iteration number and the selected point, the selected edge having an opposing edge of opposite orientation from the selected edge;
   (d) locating a second subset of the plurality of points, the second subset including the points of the plurality of points along the selected edge;
   (e) for each of the points in the first subset, removing the selected point and the opposing edge if the points of the second subset meet the pre-selected criteria;
   (f) for each of the points in the first subset not removed in (e), marking the not-removed points as not available to be selected in (b); and
   (g) repeating (a) through (f) until no points are found in (b).

6. The method of claim 5, further comprising:
   prior to removing the selected point:
       determining a first resulting interpolated length along an axis that will remain after the selected point is deleted,
       determining whether a first difference between the first resulting interpolated length and a first corresponding length in the mesh exceeds the error threshold,
       determining a second resulting interpolated length along an axis that will be removed after the selected point is deleted,
       determining whether a second difference between the second resulting interpolated length and a second corresponding length in the mesh exceeds the error threshold, and
       removing the point if neither the first difference nor the second difference exceeds the error threshold.

7. The method of claim 6, further comprising:
   determining that the point should not be removed if the first difference or the second difference exceeds the error threshold.

8. The method of claim 7, further comprising:
   if the selected point is not removed in (e):
       determining whether each point adjacent to the selected point corresponds to a not a number (NaN) value, and
       removing the selected point if each point adjacent to the selected point corresponds to a not a number (NaN) value and the selected point corresponds to a NaN value.

9. The method of claim 1, further comprising:
   replacing not a number (NaN) values in the data with a mean value for a row containing the NaN value.

10. The method of claim 1, further comprising:
    replacing not a number (NaN) values in the data with a mean value for a layer containing the NaN value.

11. A device for compressing data, the device comprising:
    a memory storing data to be compressed; and
    a compressor device configured to:
        form a mesh based on the data, wherein the mesh comprises a plurality of triangles,
        tessellate the plurality of triangles to form a right-triangulated irregular network (RTIN) structure being capable of being fully reduced to two triangles, the RTIN structure including a plurality of points and a plurality of edges,
        compress the data using the RTIN structure,
        produce a unique index number for every point within the RTIN structure,
        determine whether a difference between each point in the RTIN structure and a corresponding point in the data exceeds an error threshold, and
        for each point in the RTIN structure, if the difference between the point and the corresponding point in the data exceeds the error threshold, record the computed index value of the point in the RTIN structure and the value of that point in the data in a keep list.

12. The device of claim 11, wherein the compressor device is further configured to:
receive a query for a value of a queried point in the RTIN structure;
determine whether an index value of the queried point is in the keep list; and
return a keep list value of the queried point in the keep list if the index value of the queried point is in the keep list.

13. The device of claim 11, wherein the compressor device is further configured to:
(a) increment an iteration number;
(b) select a first subset of points from the plurality of points based on angles that edges of the plurality of edges form with the each of the plurality of points;
(c) for each of the points in the first subset, select one of the plurality of edges for deletion evaluation based on the iteration number and the selected point, the selected edge having an opposing edge of opposite orientation from the selected edge;
(d) locate a second subset of the plurality of points, the second subset including the points of the plurality of points along the selected edge;
(e) for each of the points in the first subset, remove the selected point and the opposing edge if the points of the second subset meet the pre-selected criteria;
(f) for each of the points in the first subset not removed in (e), mark the not-removed points as not available to be selected in (b); and
(g) repeat (a) through (f) until no points are found in (b).

14. The device of claim 13, wherein the compressor device is further configured to:
prior to removing the selected point:
determine a first resulting interpolated length along an axis that will remain after the selected point is deleted,
determine whether a first difference between the first resulting interpolated length and a first corresponding length in the mesh exceeds the error threshold,
determine a second resulting interpolated length along an axis that will be removed after the selected point is deleted,
determine whether a second difference between the second resulting interpolated length and a second corresponding length in the mesh exceeds the error threshold, and
remove the point if neither the first difference nor the second difference exceeds the error threshold.

15. The device of claim 14, wherein the compressor device is further configured to:
determine that the point should not be removed if the first difference or the second difference exceeds the error threshold.

16. The device of claim 13, wherein the compressor device is further configured to:
if the selected point is not removed in (e):
determine whether each point adjacent to the selected point corresponds to a not a number (NaN) value, and
remove the selected point if each point adjacent to the selected point corresponds to a not a number (NaN) value and the selected point corresponds to a NaN value.

17. The device of claim 11, wherein the compressor device is further configured to:
replace not a number (NaN) values in the data with a mean value for a row containing the NaN value.

18. The device of claim 11, wherein the compressor device is further configured to:
replace not a number (NaN) values in the data with a mean value for a layer containing the NaN value.

19. A method for compressing data, the method comprising:
forming, using a compressor device, a mesh based on the data, wherein the mesh comprises a plurality of triangles;
tessellating, using the compressor device, the plurality of triangles to form a right-triangulated irregular network (RTIN) structure being capable of being fully reduced to two triangles, the RTIN structure including a plurality of points and a plurality of edges;
compressing, using the compressor device, the data using the RTIN structure;
producing, using the compressor device, a unique index number for every point within the RTIN structure;
determining, using the compressor device, whether a difference between each point in the RTIN structure and a corresponding point in the data exceeds an error threshold;
for each point in the RTIN structure, if the difference between the point and the corresponding point in the data exceeds the error threshold, record the computed index value of the point in the RTIN structure and the value of that point in the data in a keep list;
receiving a query for a value of a queried point in the RTIN structure;
determining whether an index value of the queried point is in the keep list;
returning a keep list value of the queried point in the keep list if the index value of the queried point is in the keep list; and
returning a value of the queried point in the RTIN structure if the index value of the queried point is not in the keep list.

20. The method of claim 19, wherein compressing the data further comprises:
(a) incrementing an iteration number;
(b) selecting a first subset of points from the plurality of points based on angles that edges of the plurality of edges form with the each of the plurality of points;
(c) for each of the points in the first subset, selecting one of the plurality of edges for deletion evaluation based on the iteration number and the selected point, the selected edge having an opposing edge of opposite orientation from the selected edge;
(d) locating a second subset of the plurality of points, the second subset including the points of the plurality of points along the selected edge;
(e) for each of the points in the first subset, removing the selected point and the opposing edge if the points of the second subset meet the pre-selected criteria;
(f) for each of the points in the first subset not removed in (e), marking the not-removed points as not available to be selected in (b); and
(g) repeating (a) through (f) until no points are found in (b).

* * * * *